(12) United States Patent
Na et al.

(10) Patent No.: US 11,335,725 B2
(45) Date of Patent: May 17, 2022

(54) HIGH EFFICIENCY WIDE SPECTRUM SENSOR

(71) Applicant: Artilux, Inc., Menlo Park, CA (US)

(72) Inventors: Yun-Chung Na, San Jose, CA (US); Szu-Lin Cheng, Zhubei (TW); Shu-Lu Chen, Zhubei (TW); Han-Din Liu, Sunnyvale, CA (US); Hui-Wen Chen, Zhubei (TW)

(73) Assignee: Artilux, Inc., Menlo Park, CA (US)

( * ) Notice: Subject to any disclaimer, the term of this patent is extended or adjusted under 35 U.S.C. 154(b) by 99 days.

(21) Appl. No.: 16/801,946

(22) Filed: Feb. 26, 2020

(65) Prior Publication Data

US 2020/0194490 A1     Jun. 18, 2020

Related U.S. Application Data

(60) Continuation of application No. 15/981,713, filed on May 16, 2018, now Pat. No. 10,615,219, which is a
(Continued)

(51) Int. Cl.
*H01L 27/146* (2006.01)

(52) U.S. Cl.
CPC .. *H01L 27/14685* (2013.01); *H01L 27/14607* (2013.01); *H01L 27/14623* (2013.01);
(Continued)

(58) Field of Classification Search
None
See application file for complete search history.

(56) References Cited

U.S. PATENT DOCUMENTS

| 3,621,466 A | 11/1971 | Toshio |
| 4,341,918 A | 7/1982 | Evans, Jr. et al. |

(Continued)

FOREIGN PATENT DOCUMENTS

| CN | 104347758 | 2/2015 |
| EP | 2224319 | 9/2010 |

(Continued)

OTHER PUBLICATIONS

Kang et al, "Monolithic Ge/Si Avalanche Photodiodes," IEEE Xplore, 2009, 3 pages.
(Continued)

*Primary Examiner* — Long Pham
(74) *Attorney, Agent, or Firm* — Fish & Richardson P.C.

(57) ABSTRACT

A method for fabricating an optical sensor includes: forming, over a substrate, a first material layer comprising a first alloy of germanium and silicon having a first germanium composition; forming, over the first material layer, a graded material layer comprising germanium and silicon; and forming, over the graded material layer, a second material layer comprising a second alloy of germanium and silicon having a second germanium composition. The first germanium composition is lower than the second germanium composition and a germanium composition of the graded material layer is between the first germanium composition and the second germanium composition and varies along a direction perpendicular to the substrate.

20 Claims, 23 Drawing Sheets

Related U.S. Application Data division of application No. 15/702,482, filed on Sep. 12, 2017, now Pat. No. 10,269,862, which is a continuation of application No. 15/216,924, filed on Jul. 22, 2016, now Pat. No. 9,786,715.

(60) Provisional application No. 62/216,344, filed on Sep. 9, 2015, provisional application No. 62/209,349, filed on Aug. 25, 2015, provisional application No. 62/208,558, filed on Aug. 21, 2015, provisional application No. 62/201,590, filed on Aug. 6, 2015, provisional application No. 62/201,114, filed on Aug. 5, 2015, provisional application No. 62/195,795, filed on Jul. 23, 2015.

(52) U.S. Cl.
CPC .. *H01L 27/14643* (2013.01); *H01L 27/14689* (2013.01); *H01L 27/14621* (2013.01); *H01L 27/14627* (2013.01); *H01L 27/14634* (2013.01)

(56) References Cited

U.S. PATENT DOCUMENTS

| | | |
|---|---|---|
| 4,604,527 A | 8/1986 | Chenevas-Paula et al. |
| 4,607,168 A | 8/1986 | Oritsuki et al. |
| 4,767,936 A | 8/1988 | Muakami et al. |
| 4,782,376 A | 11/1988 | Catalano |
| 4,926,231 A | 5/1990 | Hwang et al. |
| 5,453,611 A | 9/1995 | Oozu |
| 5,673,284 A | 9/1997 | Congdon et al. |
| 5,965,875 A | 10/1999 | Merrill |
| 6,384,462 B1 | 5/2002 | Pauchard et al. |
| 6,483,130 B1 | 11/2002 | Yang et al. |
| 6,894,267 B2 | 5/2005 | Kakinuma |
| 6,958,194 B1 | 10/2005 | Hopper |
| 7,090,133 B2 | 8/2006 | Zhu |
| 7,411,265 B2 | 8/2008 | Sekiguchi |
| 7,456,874 B1 | 11/2008 | Ono |
| 7,557,368 B2 | 7/2009 | Hegarty et al. |
| 7,629,661 B2 | 12/2009 | Rafferty et al. |
| 7,750,958 B1 | 7/2010 | Dierickx |
| 7,826,058 B1 | 11/2010 | Ulrich et al. |
| 7,884,310 B2 | 2/2011 | Buettgen |
| 7,961,301 B2 | 6/2011 | Earhart et al. |
| 7,972,885 B1 | 7/2011 | Dutta et al. |
| 8,129,813 B2 | 3/2012 | Herz |
| 8,183,510 B2 | 5/2012 | Venezia et al. |
| 8,405,823 B2 | 3/2013 | Pfaff |
| 8,824,779 B1 | 9/2014 | Smyth |
| 8,860,083 B1 | 10/2014 | Trezza |
| 8,975,668 B2 | 3/2015 | Costello et al. |
| 9,236,520 B2 | 1/2016 | Okhonin |
| 9,239,626 B1 | 1/2016 | Wu et al. |
| 9,472,588 B1 | 10/2016 | Liu et al. |
| 9,635,351 B2 | 4/2017 | Dielacher et al. |
| 9,748,429 B1 | 8/2017 | Davids et al. |
| 9,786,715 B2 | 10/2017 | Na et al. |
| 9,893,112 B2 | 2/2018 | Na et al. |
| 10,418,407 B2 | 9/2019 | Na et al. |
| 10,564,718 B2 | 2/2020 | Na et al. |
| 10,615,219 B2 * | 4/2020 | Na ................... H01L 27/14689 |
| 2003/0042500 A1 | 3/2003 | Rhodes et al. |
| 2003/0189159 A1 | 10/2003 | Lnoue |
| 2004/0121507 A1 | 6/2004 | Bude et al. |
| 2005/0077588 A1 | 4/2005 | Kasuga |
| 2005/0133723 A1 | 6/2005 | Lee et al. |
| 2005/0167709 A1 | 8/2005 | Augusto |
| 2005/0186759 A1 | 8/2005 | So |
| 2005/0233495 A1 | 10/2005 | Yang et al. |
| 2006/0110844 A1 | 5/2006 | Lee et al. |
| 2006/0289957 A1 | 12/2006 | Morse et al. |
| 2007/0105256 A1 | 5/2007 | Fitzgerald |
| 2007/0164767 A1 | 7/2007 | Herz |
| 2007/0187796 A1 | 8/2007 | Rafferty et al. |
| 2007/0218578 A1 | 9/2007 | Lee et al. |
| 2007/0218580 A1 | 9/2007 | Hsu et al. |
| 2008/0121866 A1 | 5/2008 | Yuan et al. |
| 2008/0157254 A1 | 7/2008 | Kang |
| 2008/0181452 A1 | 7/2008 | Kwon et al. |
| 2008/0303058 A1 | 12/2008 | Mori et al. |
| 2009/0014764 A1 | 1/2009 | Coudrain et al. |
| 2009/0242935 A1 | 1/2009 | Fitzgerald |
| 2009/0050891 A1 | 2/2009 | Katoh |
| 2009/0152604 A1 | 6/2009 | Zhu et al. |
| 2009/0166684 A1 | 7/2009 | Yahav et al. |
| 2009/0200589 A1 | 8/2009 | Qian et al. |
| 2009/0237770 A1 | 9/2009 | Kim et al. |
| 2010/0078680 A1 | 4/2010 | Cheng et al. |
| 2010/0102409 A1 | 4/2010 | Hansson |
| 2010/0184246 A1 | 7/2010 | Sakai |
| 2011/0031578 A1 | 2/2011 | Miura et al. |
| 2011/0102553 A1 | 5/2011 | Corcoran |
| 2011/0109880 A1 | 5/2011 | Nummela |
| 2011/0128430 A1 | 6/2011 | Fossum |
| 2011/0155893 A1 | 6/2011 | Endo et al. |
| 2011/0181591 A1 | 7/2011 | Benitez |
| 2011/0188780 A1 | 8/2011 | Wang et al. |
| 2011/0255071 A1 | 10/2011 | Van Der Tempel |
| 2011/0304696 A1 | 12/2011 | Centen et al. |
| 2012/0080726 A1 | 4/2012 | Sakano |
| 2012/0133922 A1 | 5/2012 | Pfaff |
| 2012/0241769 A1 | 9/2012 | Katoh |
| 2012/0248514 A1 | 10/2012 | Korekado et al. |
| 2012/0287085 A1 | 11/2012 | Yuki et al. |
| 2012/0307232 A1 | 12/2012 | Mase |
| 2013/0026548 A1 | 1/2013 | McCarten |
| 2013/0062506 A1 | 3/2013 | Hu |
| 2013/0062522 A1 | 3/2013 | Jiang et al. |
| 2013/0062663 A1 | 3/2013 | Yuan et al. |
| 2013/0075607 A1 | 3/2013 | Bikumandla et al. |
| 2013/0119234 A1 | 5/2013 | Lee et al. |
| 2013/0128070 A1 | 5/2013 | Ishikawa |
| 2013/0154918 A1 | 6/2013 | Vaught |
| 2013/0248865 A1 | 9/2013 | Toriyama et al. |
| 2013/0278631 A1 | 10/2013 | Border et al. |
| 2013/0280879 A1 | 10/2013 | Stecher et al. |
| 2013/0283213 A1 | 10/2013 | Guendelman |
| 2013/0321271 A1 | 12/2013 | Bychkov |
| 2014/0002700 A1 | 1/2014 | Oishi |
| 2014/0043227 A1 | 2/2014 | Skogo et al. |
| 2014/0054444 A1 | 2/2014 | Sasaki |
| 2014/0054736 A1 | 2/2014 | Meade et al. |
| 2014/0111664 A1 | 4/2014 | Kumano |
| 2014/0117428 A1 | 5/2014 | Lee et al. |
| 2014/0159129 A1 | 6/2014 | Wang |
| 2014/0183549 A1 | 7/2014 | Park et al. |
| 2014/0184496 A1 | 7/2014 | Gribetz et al. |
| 2014/0206443 A1 | 7/2014 | Sharp et al. |
| 2014/0252437 A1 | 9/2014 | Ho et al. |
| 2014/0285404 A1 | 9/2014 | Takano et al. |
| 2014/0285420 A1 | 9/2014 | Kamimura et al. |
| 2014/0285641 A1 | 9/2014 | Kato et al. |
| 2014/0312206 A1 | 10/2014 | Okhonin et al. |
| 2014/0367740 A1 | 12/2014 | Morse |
| 2014/0368613 A1 | 12/2014 | Krupka |
| 2015/0001664 A1 | 1/2015 | Van Der Tempel |
| 2015/0014661 A1 | 1/2015 | Joo et al. |
| 2015/0022435 A1 | 1/2015 | Luebke |
| 2015/0041761 A1 | 2/2015 | Cheng et al. |
| 2015/0043826 A1 | 2/2015 | Ishimitsu |
| 2015/0072450 A1 | 3/2015 | El-Ghoroury et al. |
| 2015/0092983 A1 | 4/2015 | Nguyen |
| 2015/0171146 A1 | 6/2015 | Ooki et al. |
| 2015/0193938 A1 | 7/2015 | Freedman et al. |
| 2015/0331508 A1 | 9/2015 | Nho et al. |
| 2015/0281618 A1 | 10/2015 | Saito |
| 2015/0286340 A1 | 10/2015 | Send et al. |
| 2016/0027837 A1 | 1/2016 | Webster et al. |
| 2016/0049476 A1 | 2/2016 | Rachmady et al. |
| 2016/0141329 A1 | 5/2016 | Cheng et al. |
| 2016/0150174 A1 | 5/2016 | Hynecek |
| 2016/0155883 A1 | 6/2016 | Shi et al. |
| 2016/0161599 A1 | 6/2016 | Seliuchenko |

(56) References Cited

U.S. PATENT DOCUMENTS

| | | |
|---|---|---|
| 2016/0172393 A1 | 6/2016 | Kim et al. |
| 2016/0187976 A1 | 6/2016 | Levesque et al. |
| 2016/0190304 A1 | 6/2016 | Morin et al. |
| 2016/0225922 A1 | 8/2016 | Akkaya et al. |
| 2016/0239974 A1 | 8/2016 | Wang |
| 2016/0284750 A1 | 9/2016 | Ionescu et al. |
| 2016/0316159 A1 | 10/2016 | Yoneda |
| 2016/0335475 A1 | 11/2016 | Krenzer et al. |
| 2016/0372502 A1 | 12/2016 | Li et al. |
| 2016/0381789 A1 | 12/2016 | Rogers et al. |
| 2017/0040361 A1 | 2/2017 | Ikeda et al. |
| 2017/0040362 A1 | 2/2017 | Na et al. |
| 2017/0062508 A1 | 3/2017 | Na et al. |
| 2017/0068319 A1 | 3/2017 | Viswanathan |
| 2017/0075421 A1 | 3/2017 | Na et al. |
| 2017/0084648 A1 | 3/2017 | Liu et al. |
| 2017/0123233 A1 | 5/2017 | Sabovic |
| 2017/0131389 A1 | 5/2017 | Na et al. |
| 2017/0142362 A1 | 5/2017 | Liu |
| 2017/0177075 A1 | 6/2017 | Zhang |
| 2017/0196451 A1 | 7/2017 | Tian |
| 2017/0221212 A1 | 8/2017 | Adam et al. |
| 2017/0223339 A1 | 8/2017 | Kondo et al. |
| 2017/0237911 A1 | 8/2017 | Won |
| 2017/0244949 A1 | 8/2017 | Peterson |
| 2018/0006081 A1 | 1/2018 | Na et al. |
| 2018/0007255 A1 | 1/2018 | Tang |
| 2018/0012916 A1 | 1/2018 | Na et al. |
| 2018/0012917 A1 | 1/2018 | Na et al. |
| 2018/0012918 A1 | 1/2018 | Na et al. |
| 2018/0061883 A1 | 3/2018 | Na et al. |
| 2018/0137610 A1 | 5/2018 | Aflaki |
| 2018/0151732 A1 | 5/2018 | Mehandru |
| 2018/0175084 A1 | 6/2018 | Na et al. |
| 2018/0175095 A1 | 6/2018 | Sallin |
| 2018/0188356 A1 | 7/2018 | Na et al. |
| 2018/0190698 A1 | 7/2018 | Na et al. |
| 2018/0190702 A1 | 7/2018 | Na et al. |
| 2018/0233521 A1 | 8/2018 | Na et al. |
| 2018/0233528 A1 | 8/2018 | Na et al. |
| 2018/0247968 A1 | 8/2018 | Na et al. |
| 2018/0261645 A1 | 9/2018 | Na et al. |
| 2018/0269239 A1 | 9/2018 | Na et al. |
| 2019/0011984 A1 | 1/2019 | Na et al. |
| 2019/0033432 A1 | 1/2019 | Na et al. |
| 2019/0049564 A1 | 2/2019 | Na et al. |
| 2019/0103435 A1 | 4/2019 | Na et al. |
| 2019/0081095 A1 | 5/2019 | Hanzawa et al. |

FOREIGN PATENT DOCUMENTS

| | | |
|---|---|---|
| EP | 2330637 | 6/2011 |
| JP | H0548139 | 2/1993 |
| JP | 2000-133791 | 5/2000 |
| JP | 2003-225207 | 8/2003 |
| JP | 2004-103964 | 4/2004 |
| JP | 2004-309701 | 11/2004 |
| JP | 2005-123674 | 5/2005 |
| JP | 2009-025225 | 2/2009 |
| JP | 2009-047658 | 3/2009 |
| JP | 2011-66097 | 3/2011 |
| JP | 2011-128024 | 6/2011 |
| JP | 2012-146920 | 8/2012 |
| JP | 2015-194838 | 11/2015 |
| TW | 201214720 | 4/2012 |
| TW | 201216451 | 4/2012 |
| TW | 201421653 | 6/2014 |
| TW | 201503332 | 1/2015 |
| TW | 201528485 | 7/2015 |
| WO | WO 2005/036647 | 4/2005 |
| WO | WO 2013/104718 | 7/2013 |
| WO | WO 2014/085789 | 6/2014 |
| WO | WO 2014/197226 | 12/2014 |
| WO | WO 2015/104307 | 7/2015 |
| WO | WO 2016/038416 | 3/2016 |
| WO | WO 2016/077791 | 5/2016 |
| WO | WO 2016/187566 | 11/2016 |
| WO | WO 2016/208215 | 12/2016 |
| WO | WO 2017/015580 | 1/2017 |
| WO | WO 2017/018477 | 2/2017 |
| WO | WO 2017/024121 | 2/2017 |
| WO | WO 2017/035447 | 3/2017 |

OTHER PUBLICATIONS

Ramireza et al., "Recent progress on the quantum-dot avalanche photodiode," 22nd Annual Meeting of the IEEE Lasers and Electro-optics Society, Oct. 4, 2009, 2 pages.
EP Extended European Search Report in European Appln. No. 20179940, dated Feb. 2, 2021, 6 pages.
EP Search Report in European Application No. EP18189000, dated Jan. 9, 2019, 17 pages.
International Preliminary Report on Patentability in International Application No. PCT/US2016/043609, dated Jan. 23, 2018, 12 pages.
International Preliminary Report on Patentability in International Application No. PCT/US2016/045526, dated Feb. 6, 2018, 10 pages.
International Search Report and Written Opinion in International Application No. PCT/US2016/043609, dated Nov. 1, 2016, 21 pages.
International Search Report and Written Opinion in International Application No. PCT/US2016/045526, dated Nov. 22, 2016, 15 pages.
International Search Report and Written Opinion in International Application No. PCT/US2016/048915, dated Nov. 22, 2016, 17 pages.
International Search Report and Written Opinion in International Application No. PCT/US2016/060493, dated Jan. 10, 2017, 20 pages.
International Search Report and Written Opinion in International Application No. PCT/US2016/066073, dated May 6, 2018, 16 pages.
International Preliminary Report on Patentability in International Application No. PCT/US2016/048915, dated Feb. 27, 2018, 8 pages.
International Preliminary Report on Patentability in International Application No. PCT/US2016/060493, dated May 8, 2018, 11 pages.
Extended European Search Report in European Application No. 16833863, dated Jul. 18, 2018, 6 pages.
Extended European Search Report in European Application No. 181602004, dated Jul. 18, 2018, 6 pages.
Extended European Search Report in European Application No. 181602053, dated Jul. 18, 2018, 6 pages.
International Preliminary Report on Patentability in International Application No. PCT/US2016/066073, dated Jul. 12, 2018, 7 pages.
International Search Report and Written Opinion in International Application No. PCT/US2018/020262, dated Jun. 6, 2018, 14 pages.
International Search Report and Written Opinion in International Application No. PCT/US2018/025949, dated Jul. 10, 2018, 14 pages.
International Search Report and Written Opinion in International Application No. PCT/US2018/027369, dated Jul. 31, 2018, 14 pages.
Extended European Search Report in European Application No. 168630325, dated Aug. 23, 2018, 5 pages.
Extended European Search Report in European Application No. 16828622, dated Sep. 7, 2018, 6 pages.
Extended European Search Report in European Application No. 181760315, dated Aug. 27, 2018, 6 pages.
Alsam et al: "What the Eye Did Not See—A Fusion Approach to Image Coding", Advances in Visual Computing, dated Jan. 1, 2012, pp. 199-208 (with partial english translation).
Bamji et al., "A 0.13 μm CMOS System-on-Chip for a 512 ×424 Time-of-Flight Image Sensor With Multi-Frequency Photo-Demodulation up to 130 MHz and 2 GS/s ADC," IEEE J. Solid-

(56) References Cited

OTHER PUBLICATIONS

State Circuits, Jan. 2015, 50(1):303-319.

Bianco et al., "A Comparative Analysis between Active and Passive Techniques for Underwater 3D Reconstruction of Close-Range Objects," Sensors, Aug. 20, 2013, 13(8):11007-11031.

Chen et al., "Self-Aligned Microbonded Germanium Metal-Semiconductor-Metal Photodetectors Butt-Coupled to Si Waveguides," IEEE J. Sel. Top. Quant. Electron. Nov. 2014, 20(6):3800605, 5 pages.

Dalla Betta et al., "Design and Characterization of Current-Assisted Photonic Demodulators in 0.18-μm CMOS Technology," IEEE Trans. Electron. Dev., Jun. 2011, 58(6):1702-1709.

Fang et al., "An Integration PIN/MISS OEIC for High Current Photoreceiver Applications," IEEE Transactions on Electron Devices, Jan. 1997, 44(1):34-38.

Feng et al., "Vertical p-i-n germanium photodetector with high external responsivity integrated with large core Si waveguides," Optics Express, Jan. 4, 2010, 18(1):96-101.

Foix et al., "Lock-in Time-of-Flight (ToF) Cameras: A Survey," IEEE Sensors J., Sep. 2011, 11(9):1917-1926.

Fossum et al., "A Review of the Pinned Photodiode for CCD and CMOS Image Sensors," IEEE J. Electron Devices Soc. May 1, 2014, 2(3):33-43.

Hutchinson et al., "High-Resolution Aliasing-Free Optical Beam Steering," Optica, vol. 3, No. 8, dated Aug. 5, 2016, 4 pages.

Geng, "Structured-light 3D surface imaging: a tutorial," Advances in Optics and Photonics, Jun. 30, 2011, 3(2):128-160.

Gulden et al., "Novel optical distance sensor based on MSM technology." IEEE Sensors Journal. Oct. 2004, 4(5):612-8.

Joo et al., "High-sensitivity 10 Gbps Ge-on-Si photoreceiver operating at λ~1.55 μm," Optics Express, Aug. 2, 2010, 18(16):16474-16479.

Kato et al., "320×240 Back-Illuminated 10-μm CAPD Pixels for High-Speed Modulation Time-of-Flight CMOS Image Sensor," IEEE J. Solid-State Circuits Apr. 2018, 53(4):1071-1078.

Kawahito et al., "A CMOS Time-of-Flight Range Image Sensor With Gates-on-Field-Oxide Structure," IEEE Sensors J. Dec. 2007, 7(12):1578-1586.

Kim et al., "A Three-Dimensional Time-of-Flight CMOS Image Sensor With Pinned-Photodiode Pixel Structure," IEEE Electron. Dev. Lett., Nov. 2010, 31(11):1272-1274.

Koester et al., "Ge-on-SOI-Detector/Si-CMOS-Amplifier Receivers for High-Performance Optical-Communication Applications," J. Lightw. Technol., Jan. 2001, 25(1):46-57.

Lange et al., "Solid-State Time-of-Flight Range Camera," IEEE J. Quant. Electron. Mar. 2001, 37(3):390-397.

Li et al., "High-Bandwidth and High-Responsivity Top-Illuminated Germanium Photodiodes for Optical Interconnection," IEEE Trans. Electron Dev., Mar. 2013, 60(3):1183-1187.

Lischke et al., "High bandwidth, high responsivity waveguide-coupled germanium p-i-n photodiode," Optics Express, Oct. 19, 2015, 23(21):27213-27220.

Liu et al., "Backside-incidence critically coupled Ge on SOI photodetector," Proc. SPIE 10100, Optical Components and Materials, Feb. 16, 2017, XIV, 101001X, 6 pages.

Michel et al., "High-performance Ge-on-Si photodetectors," Nature Photon. Jul. 30, 2010, 4:527-534.

Morse et al., "Performance of Ge-on-Si p-i-n Photodetectors for Standard Receiver Modules," IEEE Photon. Technol. Lett., Dec. 1, 2006, 18(23):2442-2444.

Perenzoni et al., "Compact SPAD-Based Pixel Architectures for Time-Resolved Image Sensors," Sensors, May 23, 2016, 16(5):745, 12 pages.

Place et al., "Rad tolerant CMOS image sensor based on hole collection 4T pixel pinned photodiode." IEEE Transactions on Nuclear Science. Dec. 6, 2012, 59(6):2888-93.

Rafferty et a., "Monolithic germanium SWIR imaging array," 2008 IEEE Conference on Technologies for Homeland Security, Waltham, MA, May 12, 2008, p. 577-582.

Ringbeck et al., "Multidimensional measurement by using 3-D PMD sensors," Adv. Radio Sci., Jan. 1, 2007, 5:135-146.

Tseng et al., "High-performance silicon-on-insulator grating coupler with completely vertical emission," Sep. 21, 2015, 23(19):24433-9.

Tseng et al., "A self-assembled microbonded germanium/silicon heterojunction photodiode for 25 Gb/s high-speed optical interconnects," Sci. Rep. Nov. 15, 2013, 3:3225, 6 pages.

Van Der Tempel et al., "Lock-in Pixel Using a Current-Assisted Photonic Demodulator Implemented in 0.6 μm Standard Complementary Metal-Oxide-Semiconductor," Jpn. J. Appl. Phys., Apr. 24, 2017 46(4B):2377-2380.

Van Nieuwenhove et al., "Photonic Demodulator With Sensitivity Control," IEEE Sensors J. Mar. 2007, 7(3):317-318.

Wu et al., "A critically coupled Germanium photodetector under vertical illumination," Opt. Express, Dec. 31, 2012, 20(28):29338-29346.

Yin et al., "31GHz Ge n-i-p waveguide photodetectors on Silicon-on-Insulator substrate," Optics Express Oct. 17, 2007, 15(21):13965-13971.

Yokogawa et al., "IR sensitivity enhancement of CMOS Image Sensor with diffractive light trapping pixels," Sci. Rep. Jun. 19, 2017, 7(1):3832, 9 pages.

Zanuttigh et al: "ToF Depth Camera Components", Time-of-Flight and Structured Light Depth Cameras: Technology and Applications, dated May 24, 2016, pp. 31-33.

Extended European Search Report in European Application No. 16840192.5, dated Mar. 19, 2019, 7 pages.

Extended European Search Report in European Application No. 18189000.5. dated Apr. 2, 2019, 14 pages.

PCT International Search Report and Written Opinion in International Appln. PCT/US19/19167, dated May 14, 2019, 15 pages.

\* cited by examiner

| Si | 215 |
| --- | --- |
| SiO$_2$ | 213 |
| Substrate | 211 |

FIG. 2A

| Device Layer | 219 |
| --- | --- |
| Segregation Layer | 217 |
| SiO$_2$ | 213 |
| Substrate | 211 |

FIG. 2B

| Material 1 | 221 |
| --- | --- |
| Segregation Layer | 217 |
| SiO$_2$ | 213 |
| Substrate | 211 |

FIG. 2C

| Graded Material | 223 |
| --- | --- |
| Material 1 | 221 |
| Segregation Layer | 217 |
| SiO$_2$ | 213 |
| Substrate | 211 |

FIG. 2D

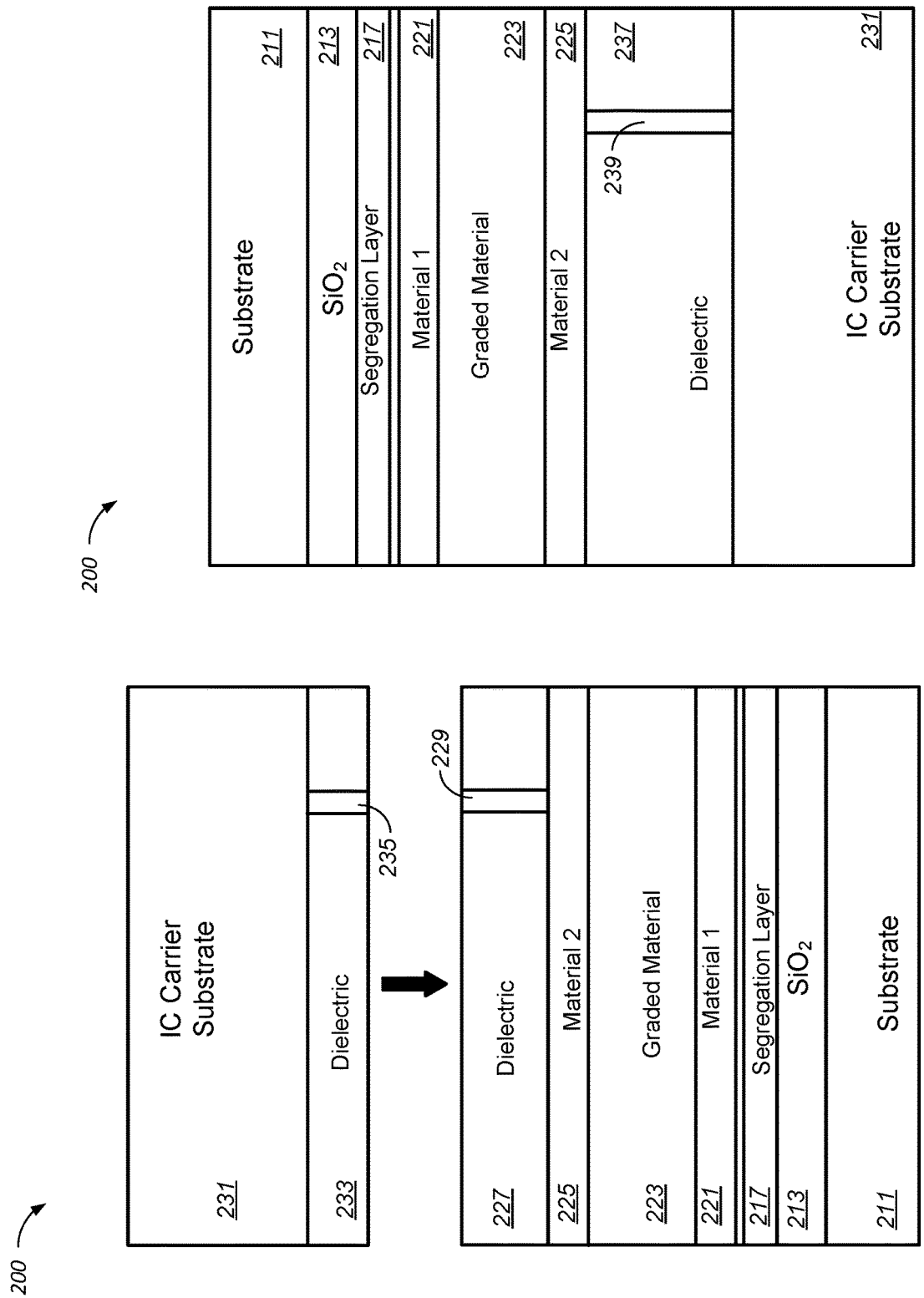

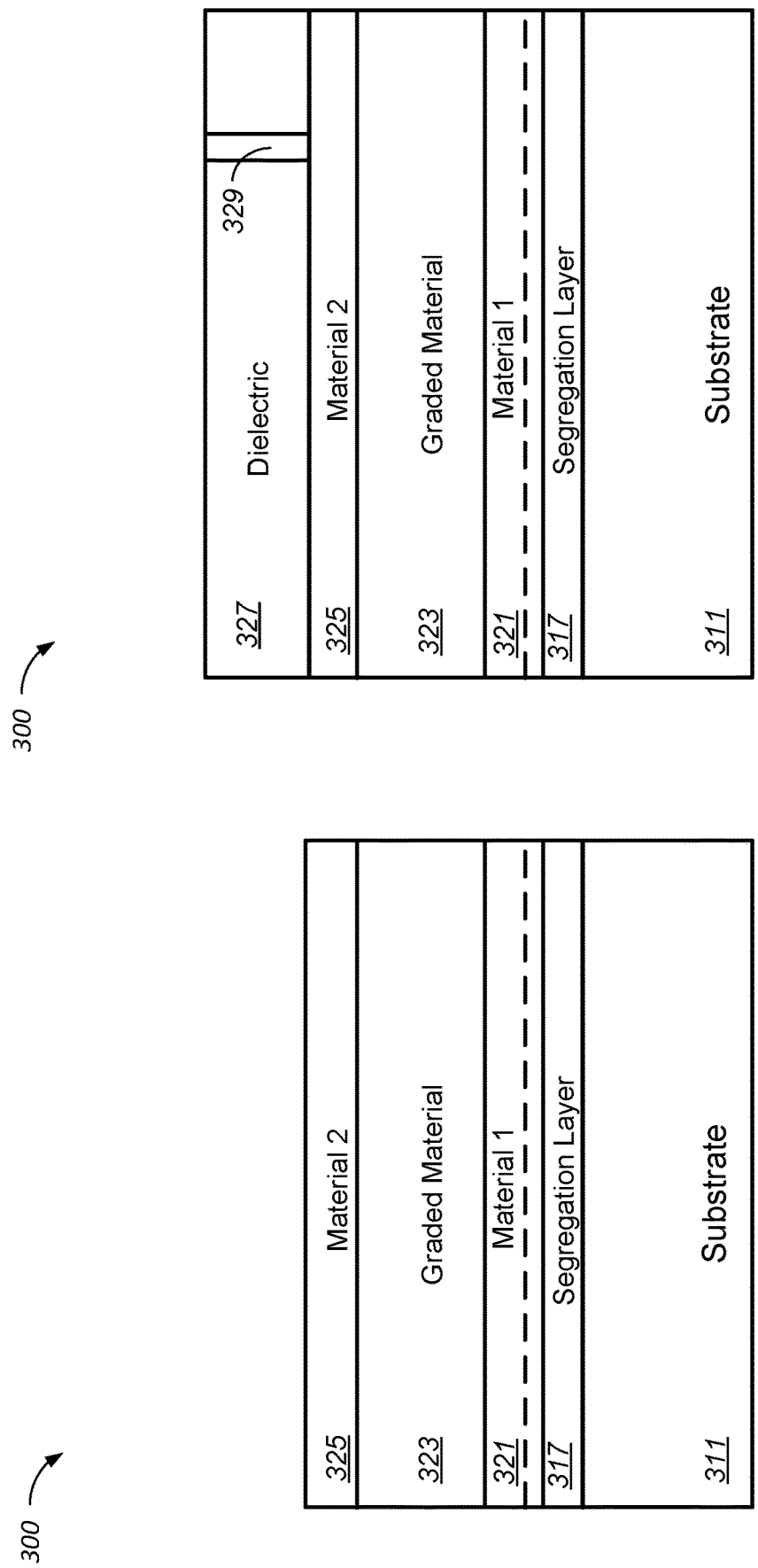

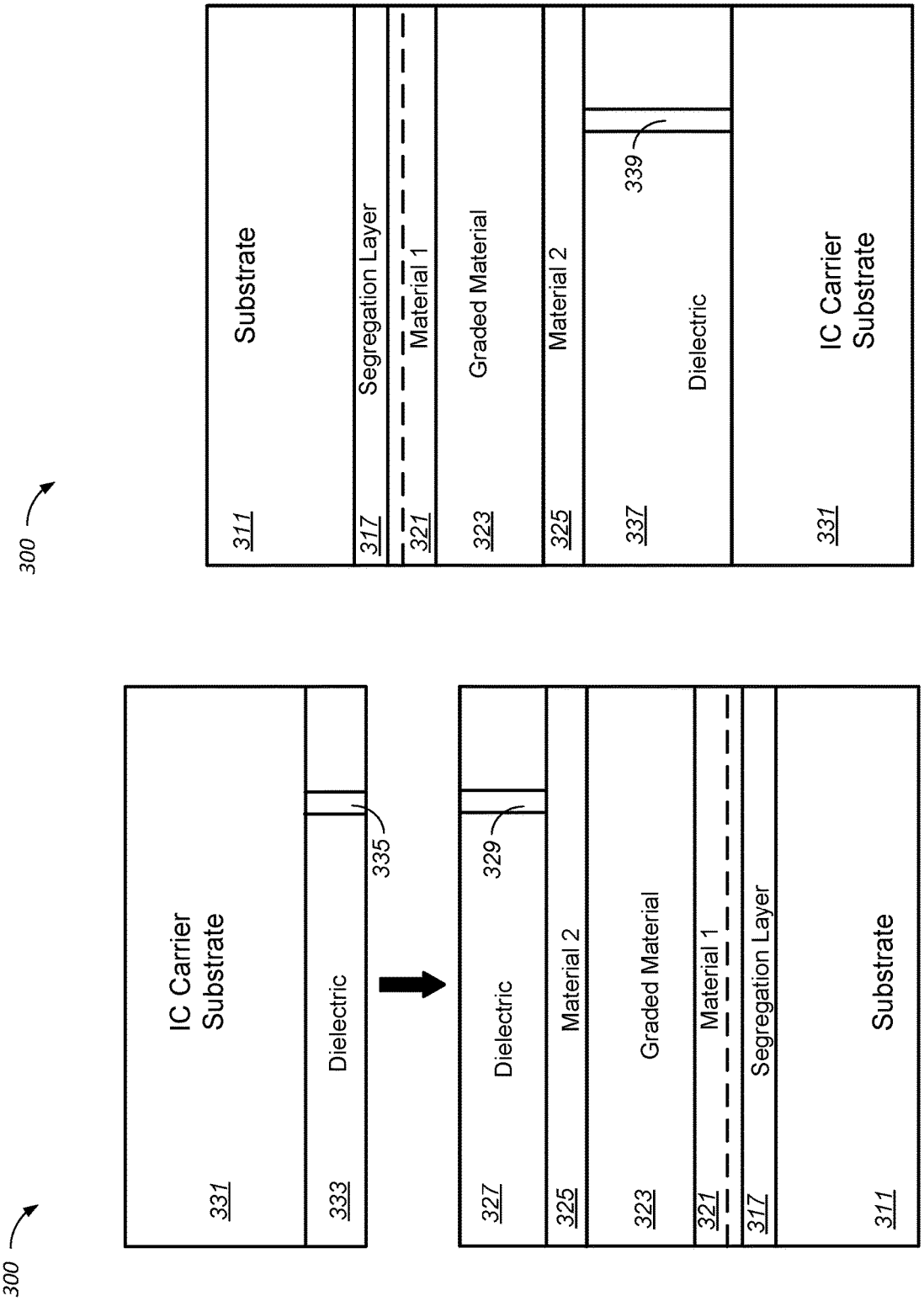

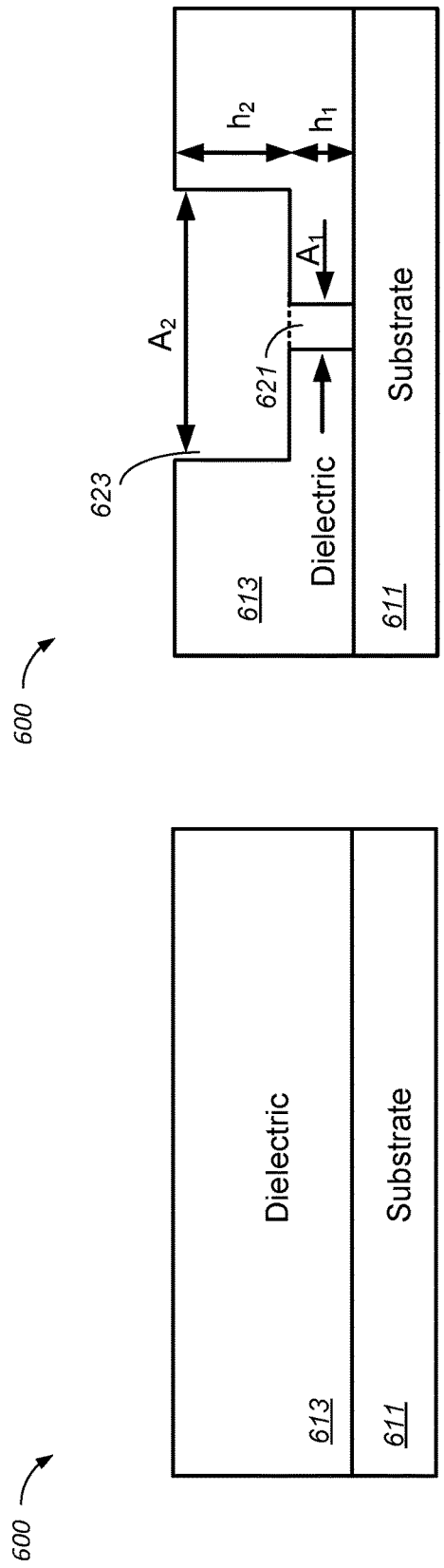
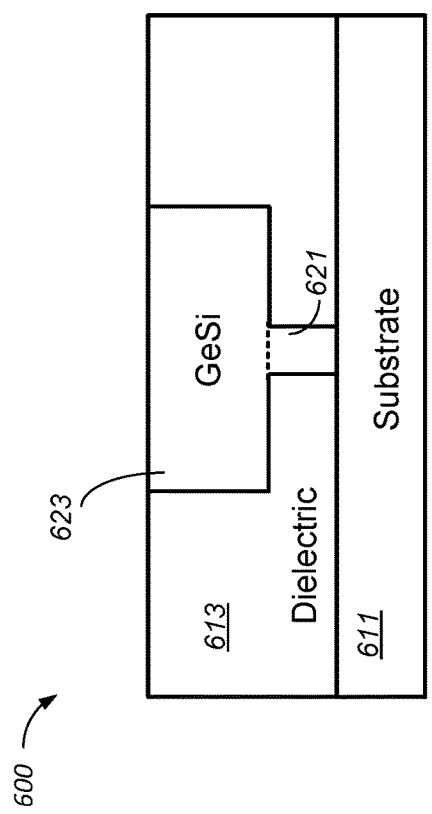
FIG. 6B
FIG. 6A
FIG. 6C

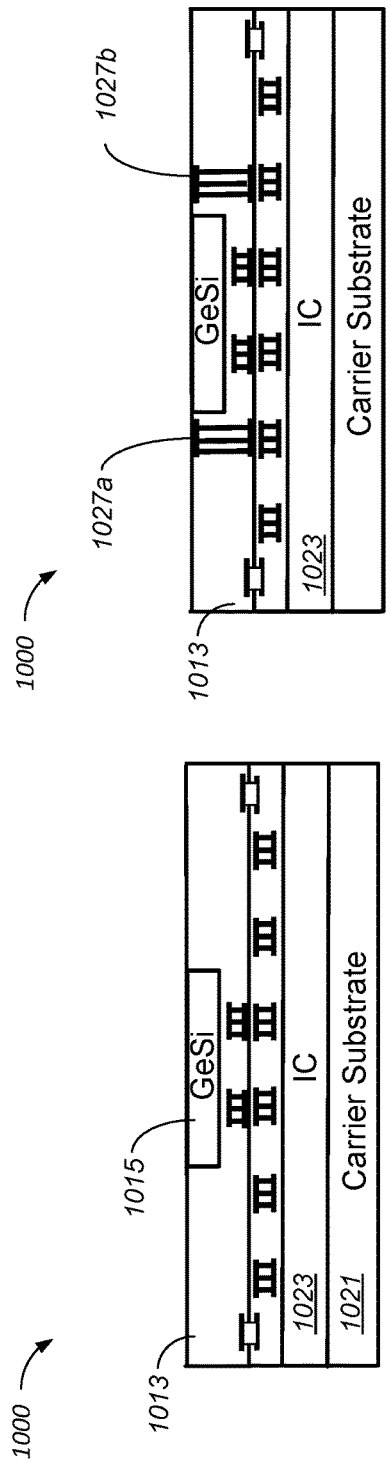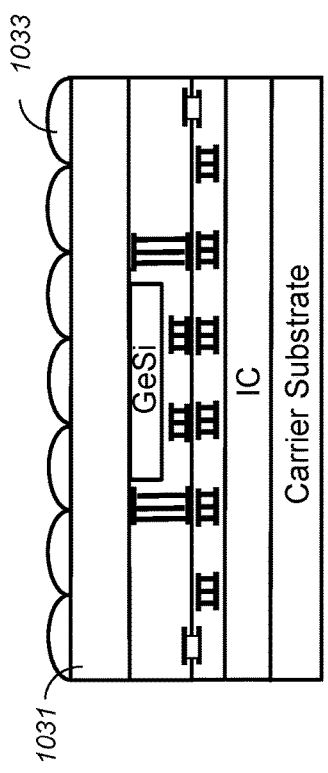
FIG. 10D
FIG. 10E
FIG. 10F

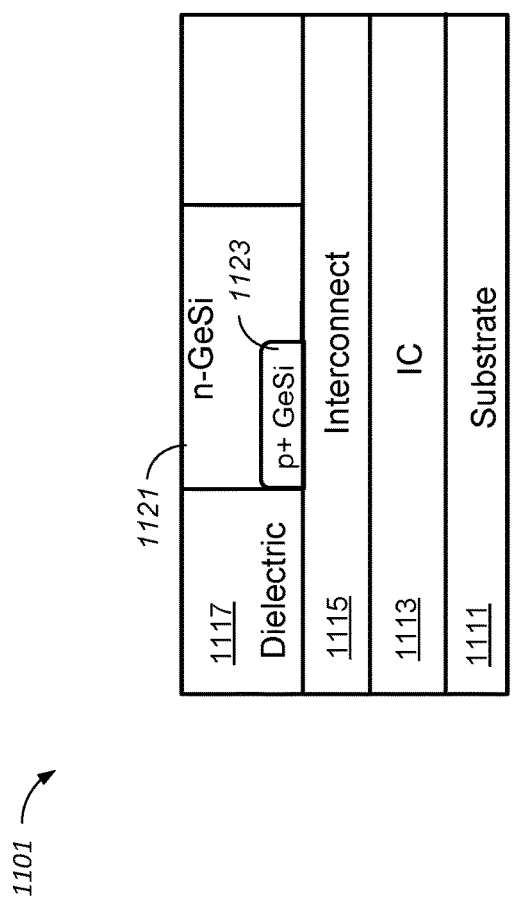
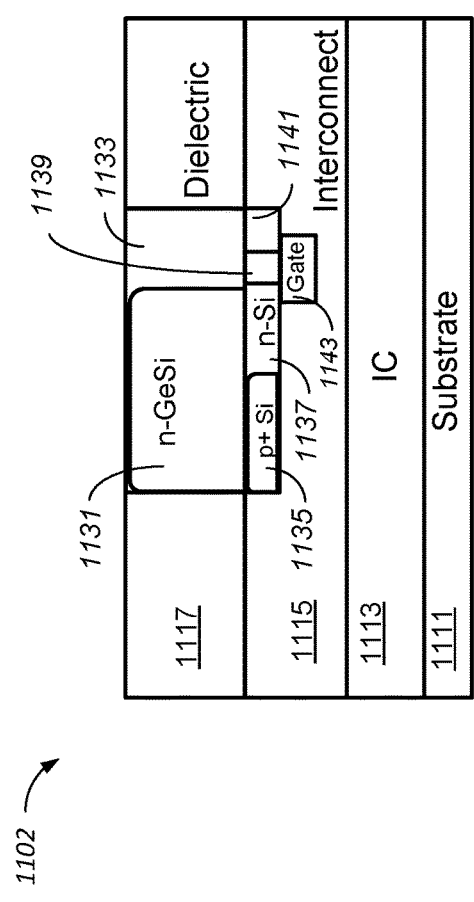
FIG. 11A
FIG. 11B

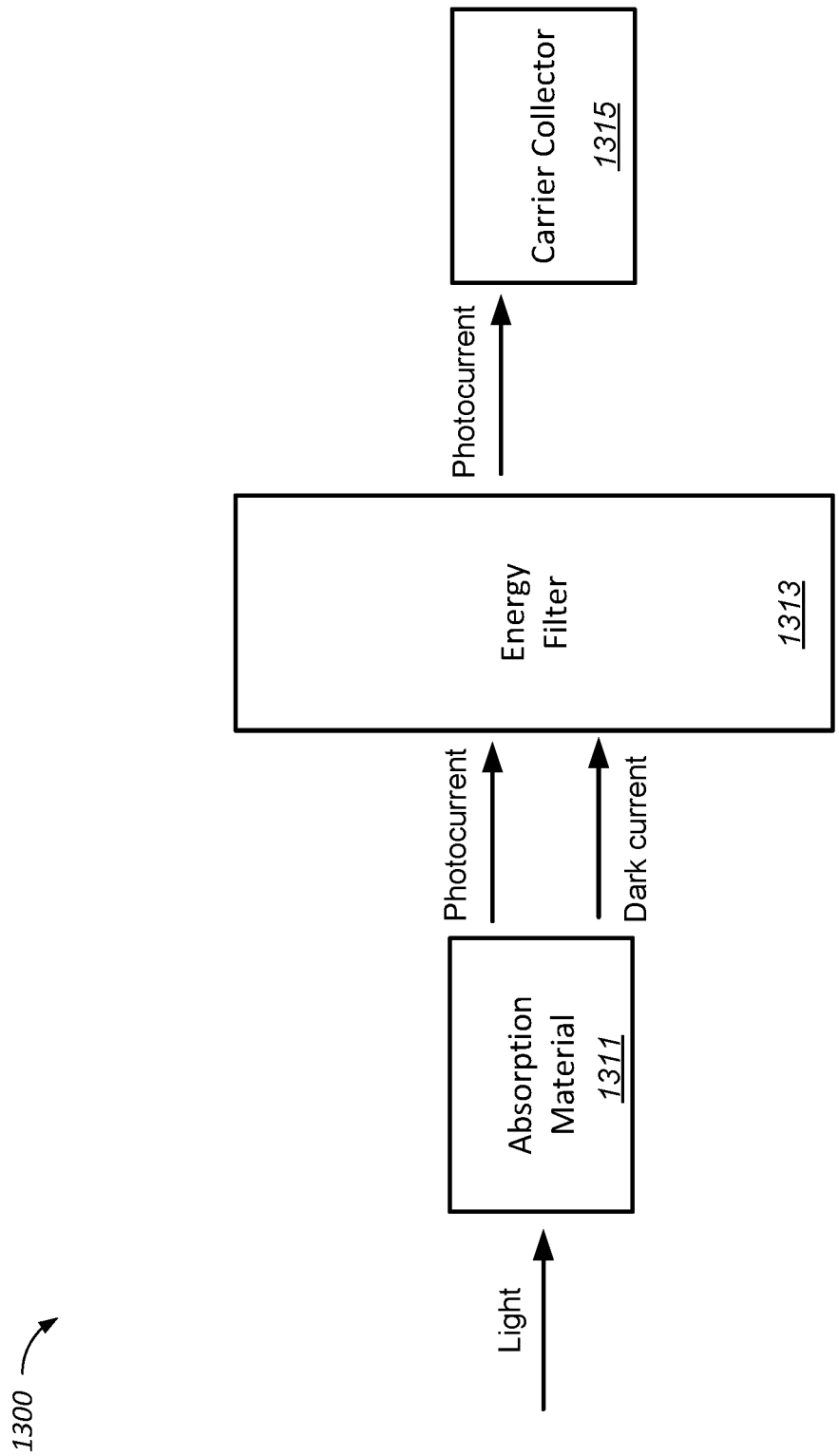

HIGH EFFICIENCY WIDE SPECTRUM SENSOR

CROSS-REFERENCE TO RELATED APPLICATIONS

This patent application is a continuation of and claims priority to U.S. Non-provisional patent application Ser. No. 15/981,713, filed May 16, 2018, which is a divisional of and claims priority to U.S. Non-provisional patent application Ser. No. 15/702,482, filed Sep. 12, 2017, now U.S. Pat. No. 10,269,862, which is a continuation of and claims priority to U.S. Non-provisional patent application Ser. No. 15/216,924, filed on Jul. 22, 2016, now U.S. Pat. No. 9,786,715, issued on Oct. 10, 2017, which claims the benefit of U.S. Provisional Patent Application No. 62/195,795, filed Jul. 23, 2015, U.S. Provisional Patent Application No. 62/201,114, filed Aug. 5, 2015, U.S. Provisional Patent Application No. 62/201,590, filed Aug. 6, 2015, U.S. Provisional Patent Application No. 62/208,558, filed Aug. 21, 2015, U.S. Provisional Patent Application No. 62/209,349, filed Aug. 25, 2015, and U.S. Provisional Patent Application No. 62/216,344, filed Sep. 9, 2015, all of which are incorporated by reference herein.

BACKGROUND

This specification relates to detecting light using an optical sensor.

Light propagates in free space or an optical medium is coupled to an optical sensor that converts an optical signal to an electrical signal for processing.

SUMMARY

Optical sensors may be used to detect optical signals and convert the optical signals to electrical signals that may be further processed by another circuitry. Optical sensors may be used in consumer electronics products, data communications, time-of-flight (TOF) applications, medical devices, and many other suitable applications. Conventionally, silicon is used as a sensor material, but silicon has a low optical absorption efficiency for wavelengths in the near-infrared (NIR) spectrum or longer. Other materials and/or material alloys such as germanium and germanium-silicon may be used as sensor materials with innovative optical device structure design described in this specification. According to one innovative aspect of the subject matter described in this specification, an optical sensor is formed using materials such as germanium or germanium-silicon to increase the speed and/or the sensitivity and/or the dynamic range and/or the operating wavelength range of the device. In one implementation, a graded material layer having graded material bandgaps may be formed in between two material layers to form a sensor having an intrinsic electric field that enhances carrier transit within the sensor. In another implementation, two graded material layers may be formed on two ends of a material layer to allow free carriers at the ends of the sensor to be collected instead of being recombined. In another implementation, a lateral strain dilution technique may be used to form a germanium or germanium-silicon sensor having reduced defects or being defect-free, which results into a lower dark current and a better sensitivity/dynamic range. In another implementation, an energy filter may be defined to block dark currents while allowing photocurrents to pass through, which further reduces the lower dark current.

In general, one innovative aspect of the subject matter described in this specification can be embodied in an optical sensor that includes a first material layer including at least a first material; a second material layer including at least a second material that is different from the first material, where a material bandgap of the first material is larger than a material bandgap of the second material; and a graded material layer arranged between the first material layer and the second material layer, the graded material layer including an alloy of at least the first material and the second material having compositions of the second material that vary along a direction that is from the first material to the second material.

This and other implementations can each optionally include one or more of the following features. The first material may be silicon and the second material may be germanium. The compositions of germanium of the graded material may increase along the direction that is from the first material to the second material. The first material layer may include an alloy of germanium and silicon having a first germanium composition. The second material layer may include an alloy of germanium and silicon having a second germanium composition. The first germanium composition may be lower than the second germanium composition. The germanium compositions of the graded material layer may be between the first germanium composition and the second germanium composition. The first material layer and the second material layer may be doped.

The optical sensor may include a substrate; and circuitry arranged over the substrate. The second material layer may be arranged over the circuitry, and the first material layer may be arranged over the second material layer.

Another innovative aspect of the subject matter described in this specification can be embodied in a method for fabricating an optical sensor, including forming, over a substrate, a first material layer comprising at least a first material; forming, over the first material layer, a graded material layer comprising an alloy of at least the first material and a second material having compositions of the second material that vary along a direction that is perpendicular from the substrate; and forming, over the graded material, a second material layer comprising at least the second material that is different from the first material.

This and other implementations can each optionally include one or more of the following features. Circuitry may be formed over the second material layer. Before forming the first material layer, a segregation layer may be formed on the substrate. A top layer formed on the substrate may be bonded to the circuitry formed on a carrier substrate. The substrate and the segregation layer may be removed. A filter and a lens may be formed over the first material layer.

Another innovative aspect of the subject matter described in this specification can be embodied in an optical sensor including a first graded material layer including a composition of at least a first material and a second material, where compositions of the second material of the first graded material layer vary along a particular direction; a second graded material layer including a composition of at least the first material and the second material, where compositions of the second material of the second graded material layer vary along the particular direction; and a third material layer arranged between the first graded material layer and the second graded material layer, the third material layer including at least the second material.

This and other implementations can each optionally include one or more of the following features. The first material may be silicon and the second material may be germanium. The particular direction may a direction from the first graded material layer to the second graded material layer. The compositions of germanium of the first graded material layer may increase along the particular direction. The compositions of germanium of the second graded material layer may decrease along the particular direction. The first graded material layer may include multiple p-doped levels along the particular direction. The second graded material layer may include multiple n-doped levels along the particular direction. The optical sensor may include conductor layers configured to provide a bias the optical sensor.

Another innovative aspect of the subject matter described in this specification can be embodied in an optical sensor that includes a first graded germanium layer including multiple p-doped levels along a particular direction; a second graded germanium layer including multiple n-doped levels along the particular direction; a third germanium layer arranged between the first graded germanium layer and the second graded germanium layer; and conductor layers configured to provide a bias to the optical sensor.

Another innovative aspect of the subject matter described in this specification can be embodied in an optical sensor including a first layer formed over a substrate, the first layer including germanium-silicon having a first strain, and the first layer having a first area; and a second layer formed over the first layer, the second layer including germanium-silicon having a second strain that is lower than the first strain, and the second layer having a second area that is larger than the first area.

Another innovative aspect of the subject matter described in this specification can be embodied in a method for fabricating an optical sensor, the method including forming a dielectric layer on a silicon substrate; forming a first opening having a first area in the dielectric layer; forming a second opening having a second area that is larger than the first area in the dielectric layer; forming a first germanium-silicon layer in the first opening; and forming a second germanium-silicon layer in the second opening, wherein a strain of the first germanium-silicon layer is higher than a strain of the second germanium-silicon layer.

This and other implementations can each optionally include one or more of the following features. Circuitry may be formed over the second germanium-silicon layer. A top layer of the silicon substrate may be bonded to circuitry of a carrier substrate. The silicon substrate and at least a portion of the first germanium-silicon layer may be removed. A filter and a lens may be formed over the second germanium-silicon layer.

Advantageous implementations may include one or more of the following features. Germanium is an efficient absorption material for near-infrared wavelengths, which reduces the problem of slow photo-carriers generated at a greater substrate depth when an inefficient absorption material, e.g., silicon, is used. An increased operation speed allows the use of a higher modulation frequency in an optical sensing system, giving advantages such as a greater depth resolution. An alloy germanium-silicon material as the optical absorption layer provides higher optical absorption efficiency over conventional Si material, which may provide a more sensitive sensor in the visible and near-infrared spectrums, may reduce crosstalk between neighboring pixels, and may allow for a reduction of pixel sizes. A composition gradient within the alloy material may enhance carrier transit within the material, which reduces carrier recombination and hence improves quantum efficiency. A composition gradient within the alloy material may reduce the operation voltage of the image sensor. A composition gradient within the alloy material may reduce diode dark current. The sensor component can be readily integrated with existing CMOS sensor technology.

The details of one or more implementations are set forth in the accompanying drawings and the description below. Other potential features and advantages will become apparent from the descriptions, the drawings, and the claims.

BRIEF DESCRIPTION OF THE DRAWINGS

FIGS. 2A-2J illustrate an example design for fabricating a graded material optical sensor on a silicon-on-insulator (SOI) substrate.

FIGS. 3A-3J illustrate an example design for fabricating a graded material optical sensor on a silicon substrate.

FIGS. 6A-6C illustrate an example design for fabricating an optical sensor using a lateral strain dilution technique.

FIGS. 10A-10F illustrate an example design for fabricating an optical sensor using a lateral strain dilution technique.

FIG. 11A-11B show design examples of an optical sensor formed by a lateral strain dilution technique.

FIG. 13 shows an example energy selection sensor.

Like reference numbers and designations in the various drawings indicate like elements. It is also to be understood that the various exemplary embodiments shown in the figures are merely illustrative representations and are not necessarily drawn to scale.

DETAILED DESCRIPTION

Graded Material Sensors

In general, a material absorbs light at various wavelengths to generate free carriers depending on an energy bandgap associated with the material. For example, silicon may have an energy bandgap of 1.12 eV, germanium may have an energy bandgap of 0.66 eV, and a germanium-silicon alloy may have an energy bandgap between 0.66 eV and 1.12 eV depending on the composition. A material having a lower energy bandgap has a higher absorption coefficient at a particular wavelength. If the absorption coefficient of a material is too low, the optical signal cannot be converted to an electrical signal efficiently. However, if the absorption coefficient of a material is too high, free carriers will be generated near the surface of the material, which may be recombined to reduce efficiency. Silicon is not an efficient sensor material for NIR wavelengths. On the other hand, germanium has an absorption coefficient that may be too high for shorter wavelengths (e.g., blue), where free carriers may recombine at the surface. Incorporating a graded material structure design where the germanium-silicon composition varies along the propagation of the light in an optical sensor enables the optical sensor to have a wide absorption spectrum.

Figure 1A:
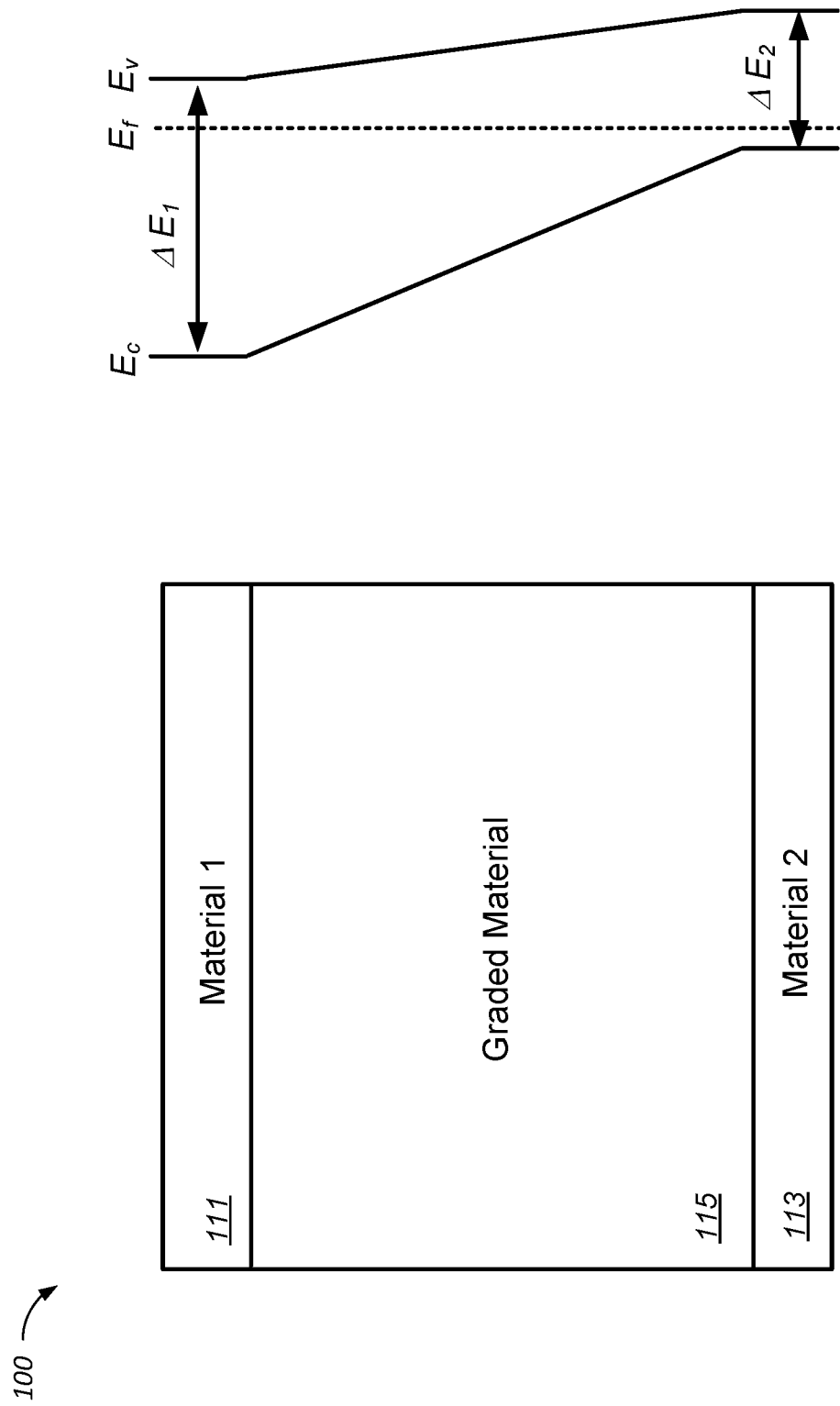
FIGS. 1A and 1B show examples of a graded material optical sensor.

FIG. 1A is an example graded material optical sensor 100 for converting an optical signal to an electrical signal. The graded material optical sensor 100 includes a first material layer 111, a second material layer 113, and a graded material layer 115 that is between the first material layer 111 and the second material layer 113. The graded material optical sensor 100 may absorb light that propagates along a direction from the first material layer 111 towards the second material layer 113. In general, the first material layer 111 has an energy bandgap $\Delta E_1$ that is larger than the energy bandgap $\Delta E_2$ of the second material layer 113. The graded material layer 115 has an energy bandgap that is in between $\Delta E_1$ and $\Delta E_2$, and decreases in a direction from the first material layer 111 to the second material layer 113, such that light of a wide wavelength spectrum may be efficiently absorbed inside the graded material optical sensor 100. For example, an optical signal having a shorter wavelength (e.g., blue) would be absorbed by the first material layer 111 formed by silicon and a front section of the graded material layer 115 that has a low germanium composition. An optical signal having a longer wavelength (e.g., NIR) would not be absorbed by the first material layer 111 formed by silicon or the front section of the graded material layer 115 that has a low germanium composition, but would be absorbed by a back section of the graded material layer 115 that has a high germanium composition and the second material layer 113 formed by germanium.

In some implementations, the first material layer 111 may be formed using a first material. For example, the first material may be silicon, germanium, or any other suitable semiconductor materials. In some implementations, the first material layer 111 may be formed using an alloy of different materials. For example, the first material layer 111 may be formed using germanium-silicon. In some implementations, the second material layer 113 may be formed using a second material. For example, the second material may be silicon, germanium, or any other suitable semiconductor materials. In some implementations, the second material layer 113 may be formed using an alloy of different materials. For example, the second material layer 113 may be formed using germanium-silicon. In some implementations, the graded material layer 115 may be formed using an alloy of at least the first material and the second material. For example, the graded material layer 115 may be formed using germanium-silicon.

In some implementations, the first material layer 111, the second material layer 113, and/or the graded material layer 115 may be doped to control the Fermi level of the material. For example, the first material layer 111 may be heavily p-doped, the second material layer 113 may be heavily n-doped, and the graded material layer 115 may be intrinsic or gradient-doped. When the thermal equilibrium is reached, an electric field may be formed in the graded material layer 115. The electric field enhances free carriers (e.g., electrons or holes) transit towards a carrier-collection circuitry to improve sensitivity and to reduce crosstalk of the optical sensor.

In some implementations, a control bias may be applied to the graded material optical sensor 100. Although not shown in FIG. 1A, the graded material optical sensor 100 may include contact pads and control circuitry that may be coupled to a control source. For example, the control bias may be a reverse bias in voltage. The control bias may increase the electric field between the first material layer 111 and the second material layer 113, which may further enhance free carriers transit towards a carrier-collection circuitry.

Figure 1B:
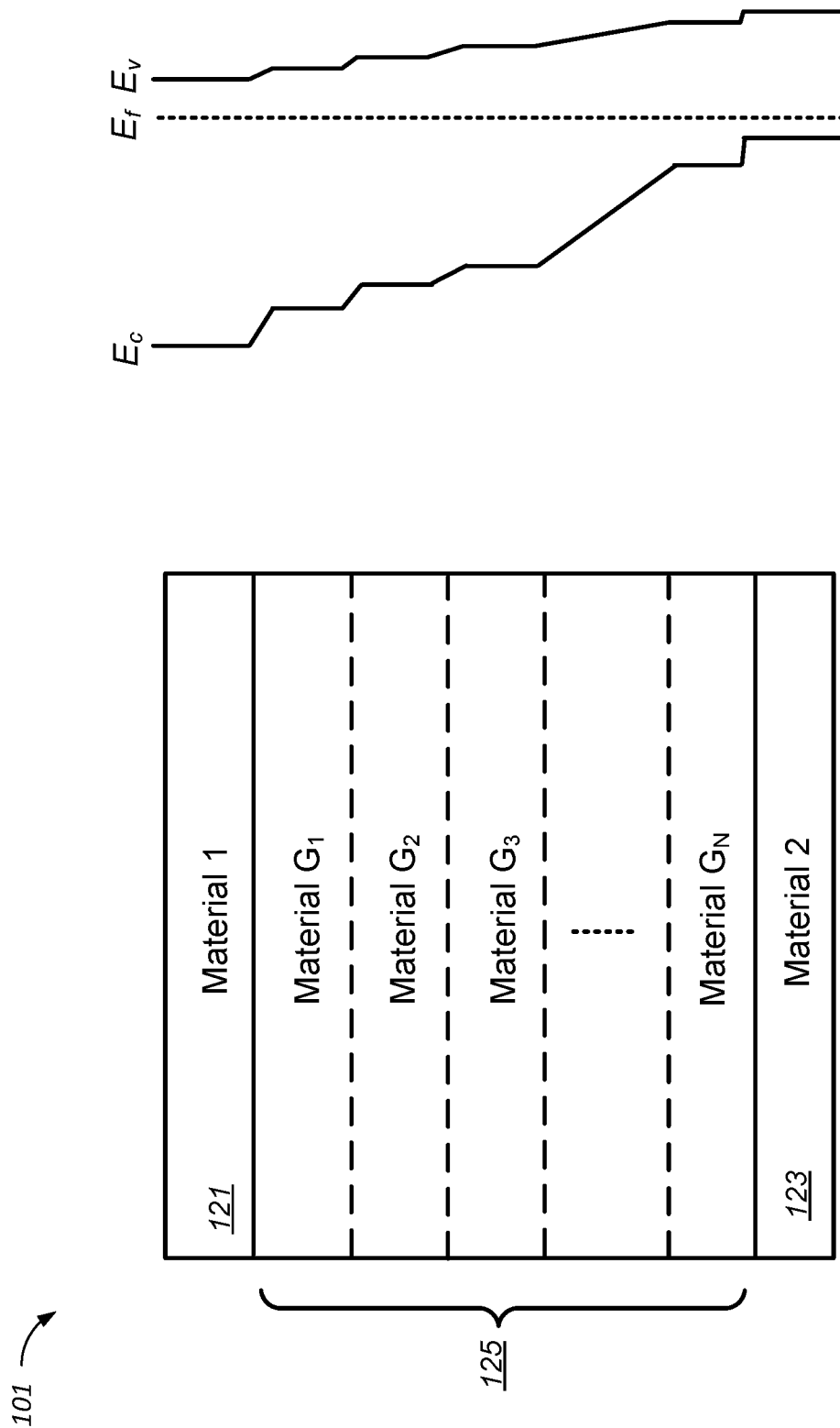

FIG. 1B is an example graded material optical sensor 101 for converting an optical signal to an electrical signal. The graded material optical sensor 101 includes a first material layer 121, a second material layer 123, and a graded material layer 125 that is between the first material layer 121 and the second material layer 123. The graded material optical sensor 101 is similar to the graded material optical sensor 100 described in reference to FIG. 1A. The graded material layer 125 includes N material layers $G_1$ to $G_N$, where N is an integer. Each layer of material layers $G_1$ to $G_N$ may be formed using an alloy of at least the first material and the second material. For example, the material layer $G_1$ may have material compositions of $Ge_{0.1}Si_{0.9}$, the material layer $G_2$ may have material compositions of $Ge_{0.2}Si_{0.8}$, and the germanium composition may increase as the layer number increases. In some implementations, a thickness of each layer of the material layers $G_1$ to $G_N$ may be controlled. In some implementations, a doping of each layer of the material layers $G_1$ to $G_N$ may be controlled. In some implementations, a germanium composition of each layer of the material layers $G_1$ to $G_N$ may be controlled.

Figures 2E, 2F:
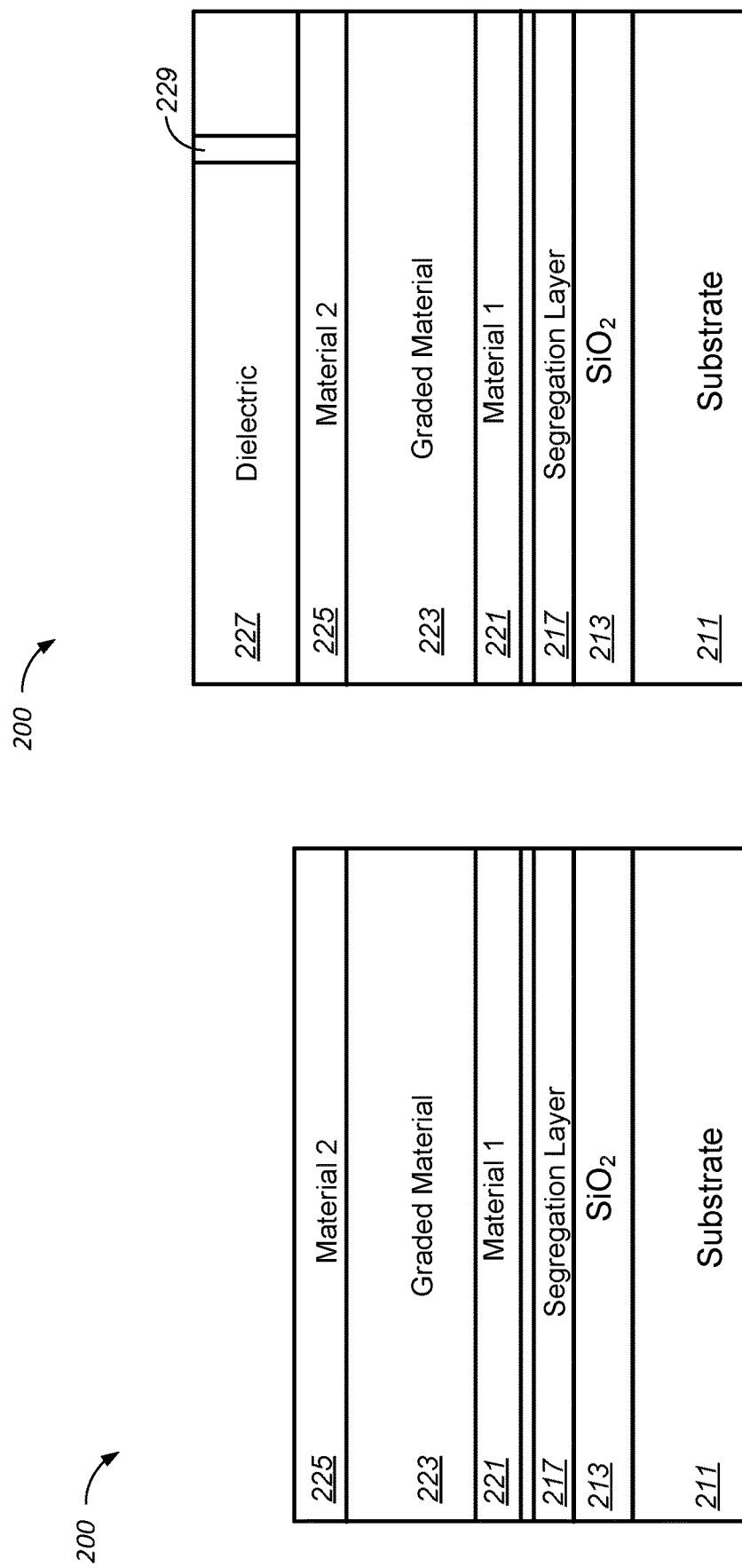

FIGS. 2A-2J illustrate an example design 200 for fabricating a graded material optical sensor structure on a silicon-on-insulator (SOI) substrate. Referring to FIG. 2A, a SOI substrate includes a silicon substrate layer 211, an oxide layer 213, and a silicon layer 215. The silicon layer 215 may be formed by epitaxial silicon having a specific crystal orientation or a specific thickness, or the silicon layer 215 may be formed by amorphous silicon having a specific thickness. Referring to FIG. 2B, a segregation layer 217 and a device layer 219 may be formed in the silicon layer 215. The segregation layer 217 may be formed using any suitable technique. For example, the segregation layer 217 may be formed by ion implantation at a specific ion energy to achieve a specific damage depth, or by in-situ doped epitaxy to create removal rate contrast between segregation and substrate layers. The device layer 219 may be intrinsic silicon or doped silicon. In some implementations, the device layer 219 may be formed by epitaxy or deposition.

Referring to FIG. 2C, a first material layer 221 is formed in the device layer 219. The first material layer 221 may be formed by doping the device layer 219. The first material layer 221 may be similar to the first material layer 111 or the first material layer 121 as described in reference to FIG. 1A and FIG. 1B. In some implementations, the doped layer may be limited to certain percentage of the entire wafer area. In some implementations, circuitry may be formed within the first material layer 221.

Referring to FIG. 2D, a graded material 223 is formed on the first material layer 221. The graded material layer 223 may be similar to the graded material layer 115 or the graded material layer 125 as described in reference to FIG. 1A and FIG. 1B. For example, the graded material layer 223 may be a germanium-silicon alloy, where the germanium composition increases with increasing thickness. The graded material layer 223 may be formed by any suitable fabrication techniques. For example, the graded material layer 223 may be formed by epitaxial growth through chemical vapor deposition (CVD) system with dynamic gas control. In some implementations, the graded material layer 223 may be gradient-doped. For example, the graded material layer 223 may be doped by phosphorus, where the phosphorus concentration would increase with increasing thickness. In some implementations, circuitry may be formed within the graded material layer 223.

Referring to FIG. 2E, a second material layer 225 is formed on the graded material layer 223. The second material layer 225 may be similar to the second material layer 113 or the second material layer 123 as described in reference to FIG. 1A and FIG. 1B. For example, the second material layer 225 may be formed using a doped germanium. In some implementations, circuitry may be formed within the second material layer 225.

Referring to FIG. 2F, a dielectric layer 227 is formed on the second material layer 225. The dielectric layer 227 may be any suitable insulator such as oxide. The dielectric layer 227 may be formed using any suitable fabrication technique such as CVD. In some implementations, interconnects 229 may be formed in the dielectric layer 227. The interconnects 229 may be formed by etching a contact hole through the dielectric layer 227 and filling the contact hole by a conductive material. For example, the interconnects 229 may be formed by dry-etching a contact hole through the dielectric layer 227 and filling the contact hole by a copper using CVD.

Referring to FIG. 2G, a dielectric layer 233 of an IC (integrated circuit) carrier substrate 231 is bonded with the dielectric layer 227 of the substrate 211. The IC carrier substrate 231 may be a silicon substrate, where one or more layers of circuitry may be formed on the silicon substrate. The circuitry may be control circuitry, readout circuitry, analog-to-digital convertor (ADC), amplifier, row/column decoder, and/or any other suitable circuitry for the optical sensor. The dielectric layer 233 and interconnects 235 are formed on the IC carrier substrate. Although not shown in the figure, in some implementations, alignment marks may be formed in both the dielectric layer 227 and the dielectric layer 233 by any suitable techniques. The bonding between the dielectric layer 233 of the IC carrier substrate 231 may be bonded with the dielectric layer 227 of the substrate 211 by any suitable techniques such as thermally enhanced bonding or hybrid bonding.

FIG. 2H illustrates a bonded optical sensor 200, where the dielectric layer 233 of the IC carrier substrate 231 are bonded with the dielectric layer 227 of the substrate 211 to form a dielectric layer 237, and where the interconnects 229 and the interconnects 235 are connected to form interconnects 239. In some implementations, metal pads can be included on top of the interconnects 229 and 235 to facilitate the wafer bonding process.

Figure 2J:
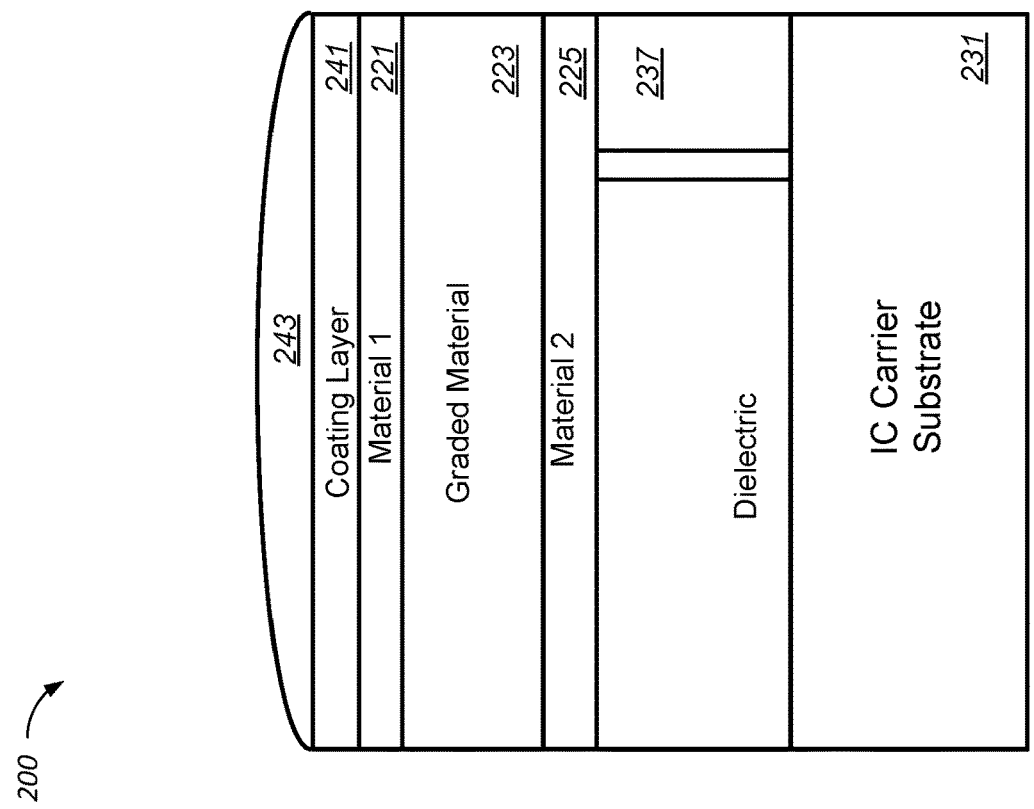
Figure 2I:
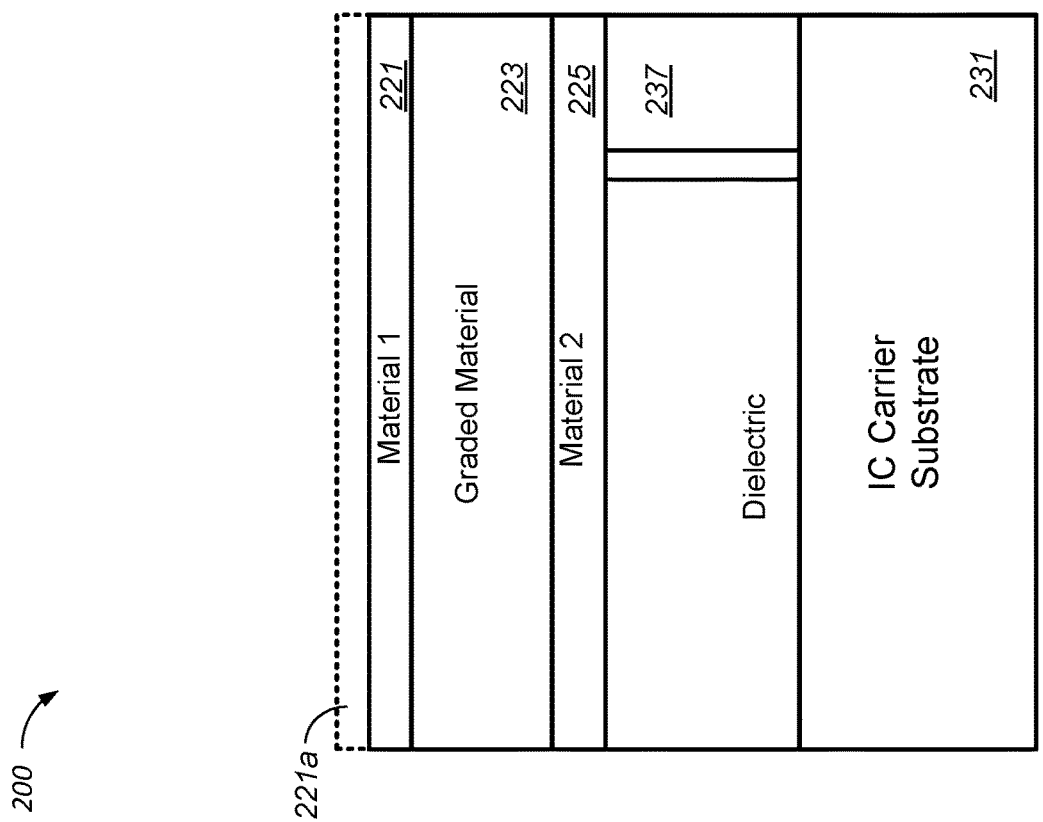

Referring to FIG. 2I, the substrate 211, the oxide layer 213, and the segregation layer 217 are removed through any suitable techniques such as chemical mechanical polishing (CMP) or etching. In some implementations, a portion 221a of the first material layer 221 may be removed through any suitable techniques such as CMP or etching. In some implementations, one or more metal routing layers may be formed.

Although not shown here, in some other implementations, the formation of the segregation layer 217 is not required. Without the formation of the segregation layer 217, the substrate 211 and the oxide layer 213 may be removed through any suitable techniques such as CMP or etching to expose the first material layer 221. A portion 221a of the first material layer 221 may then be removed through any suitable techniques such as CMP or etching.

Referring to FIG. 2J, one or more coating layers 241 may be formed on the first material layer 221. The coating layers 241 may function such as wavelength filtering, anti-reflection, and/or any other suitable functions. The one or more coating layers 241 may be formed using any suitable film deposition techniques such as sputtering, evaporation, and/or plasma-enhanced CVD. In some implementations, micro lens 243 may be formed on the one or more coating layers 241. The micro lens 243 may function as a focusing lens, a collimator, or any other suitable optical function.

Figure 3B:
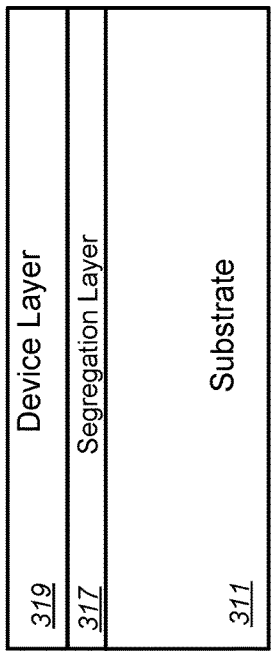
Figure 3D:
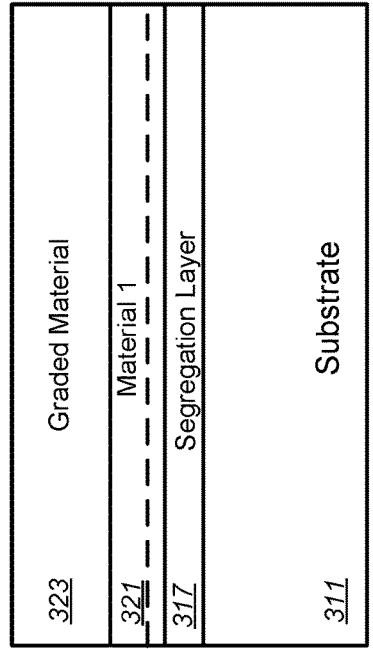
Figure 3A:
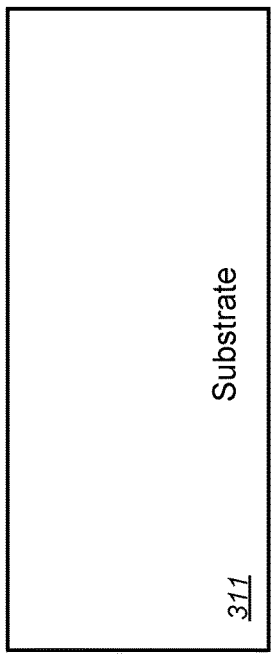

FIGS. 3A-3J illustrate an example design 300 for fabricating a graded material optical sensor structure on a substrate. FIG. 3A shows a substrate 311. The substrate 311 may be a silicon substrate or any other suitable substrate. The substrate may be formed by epitaxial silicon having a specific crystal orientation or a specific thickness, or by amorphous silicon having a specific thickness. Referring to FIG. 3B, a segregation layer 317 and a device layer 319 may be formed in the substrate layer 311. The segregation layer 317 may be formed using any suitable technique similar to the techniques described in reference to FIG. 2B. The device layer 319 may be intrinsic silicon or doped silicon. In some implementations, the device layer 319 may be formed by epitaxy or deposition.

Figure 3C:
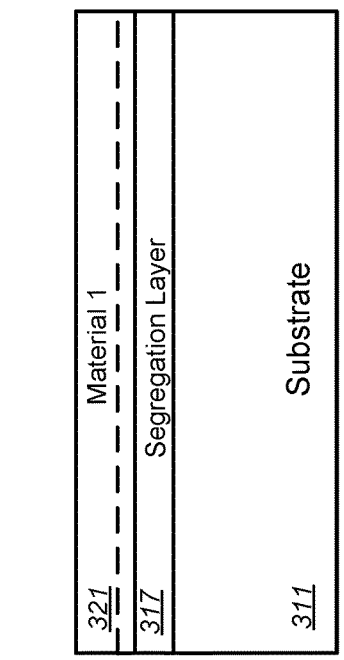

Referring to FIG. 3C, a first material layer 321 is formed in the device layer 319. The first material layer 321 may be formed by any suitable technique similar to the techniques described in reference to FIG. 2C. Referring to FIG. 3D, a graded material 323 is formed on the first material layer 321. The graded material layer 323 may be formed by any suitable technique similar to the techniques described in reference to FIG. 2D. In some implementations, circuitry may be formed within the first material layer 321. In some implementations, circuitry may be formed within the graded material layer 323.

Referring to FIG. 3E, a second material layer 325 is formed on the graded material layer 323. The second material layer 325 may be formed by any suitable technique similar to the techniques described in reference to FIG. 2E. In some implementations, circuitry may be formed within the second material layer 325.

Referring to FIG. 3F, a dielectric layer 327 is formed on the second material layer 325. The dielectric layer 327 may be formed by any suitable technique similar to the techniques described in reference to FIG. 2F. In some implementations, interconnects 329 may be formed in the dielectric layer 327. The interconnects 329 may be formed by any suitable technique similar to the techniques described in reference to FIG. 2F.

Referring to FIG. 3G, a dielectric layer 333 of an IC carrier substrate 331 is bonded with the dielectric layer 327 of the substrate 311. The IC carrier substrate 331 is similar to the IC carrier substrate 231 as described in reference to FIG. 2G. The dielectric layer 333 and interconnects 335 are formed on the IC carrier substrate by any suitable technique similar to the techniques described in reference to FIG. 2G. The bonding between the dielectric layer 333 of the IC carrier substrate 331 may be bonded with the dielectric layer 327 of the substrate 311 by any suitable technique similar to the techniques described in reference to FIG. 2G.

FIG. 3H illustrate a bonded optical sensor 300, where the dielectric layer 333 of the IC carrier substrate 331 are bonded with the dielectric layer 327 of the substrate 311 to form a dielectric layer 337, and where the interconnects 329 and the interconnects 335 are connected to form interconnects 339. In some implementations, metal pads can be included on top of the interconnects 329 and 335 to facilitate the wafer bonding process. Referring to FIG. 3I, the substrate 311 and the segregation layer 317 are removed through any suitable techniques as described in reference to FIG. 2I. In some implementations, a portion 321a of the first material layer 321 may be removed through any suitable techniques such as CMP or etching. In some implementations, one or more metal routing layers may be formed.

Figure 3J:
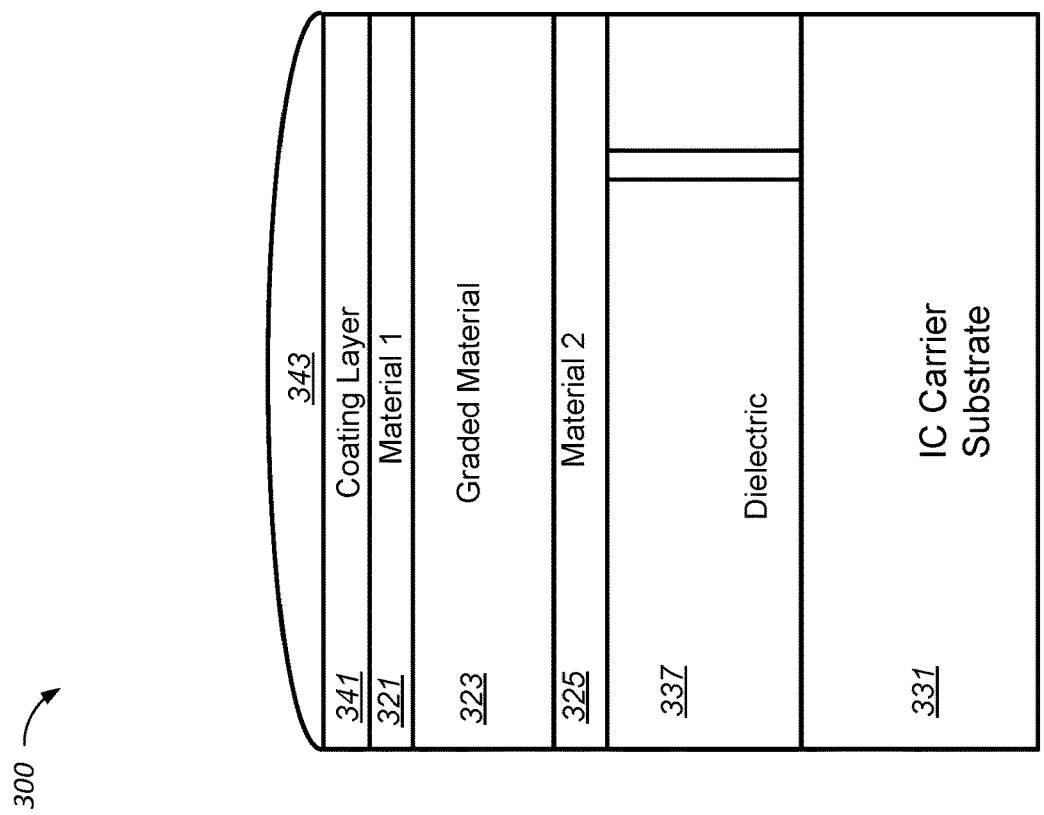
Figure 3I:
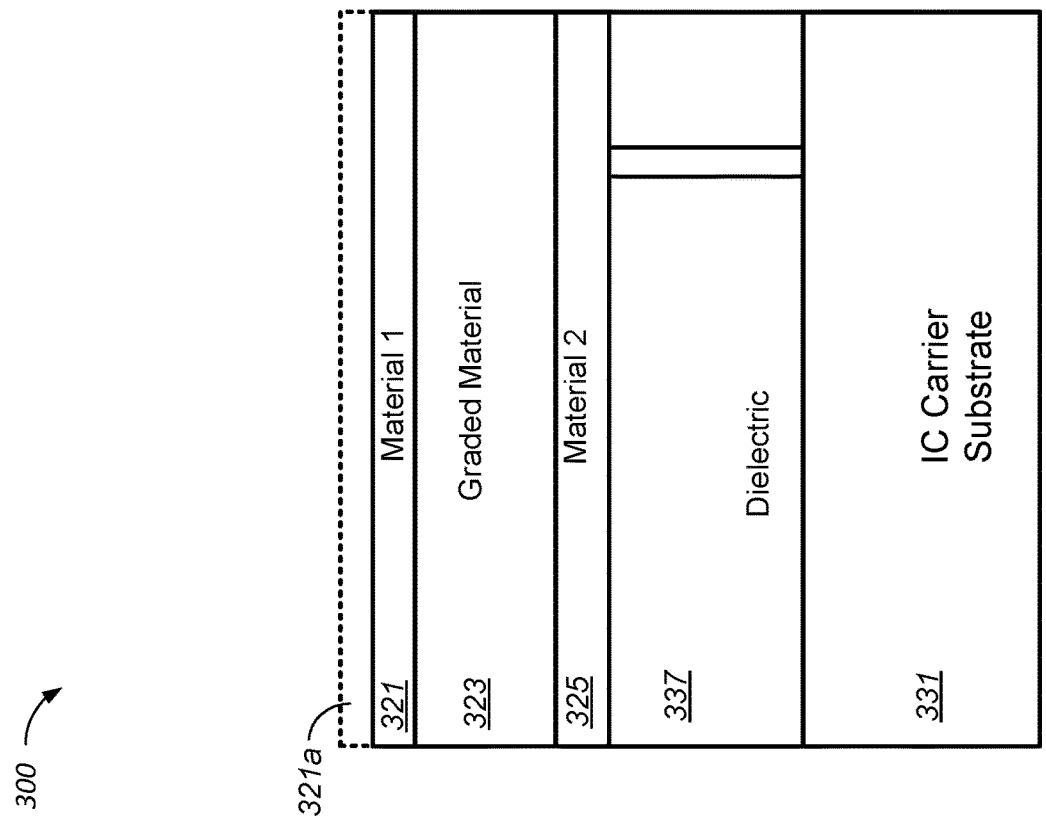

Referring to FIG. 3J, one or more coating layers 341 may be formed on the first material layer 321. The coating layers 341 may function such as wavelength filtering, anti-reflection, and/or any other suitable functions. The one or more coating layers 341 may be formed using any suitable film deposition techniques such as sputtering, evaporation, and/or plasma-enhanced CVD. In some implementations, micro lens 343 may be formed on the one or more coating layers 341. The micro lens 343 may function as a focusing lens, a collimator, or any other suitable optical function.

Figure 4A:
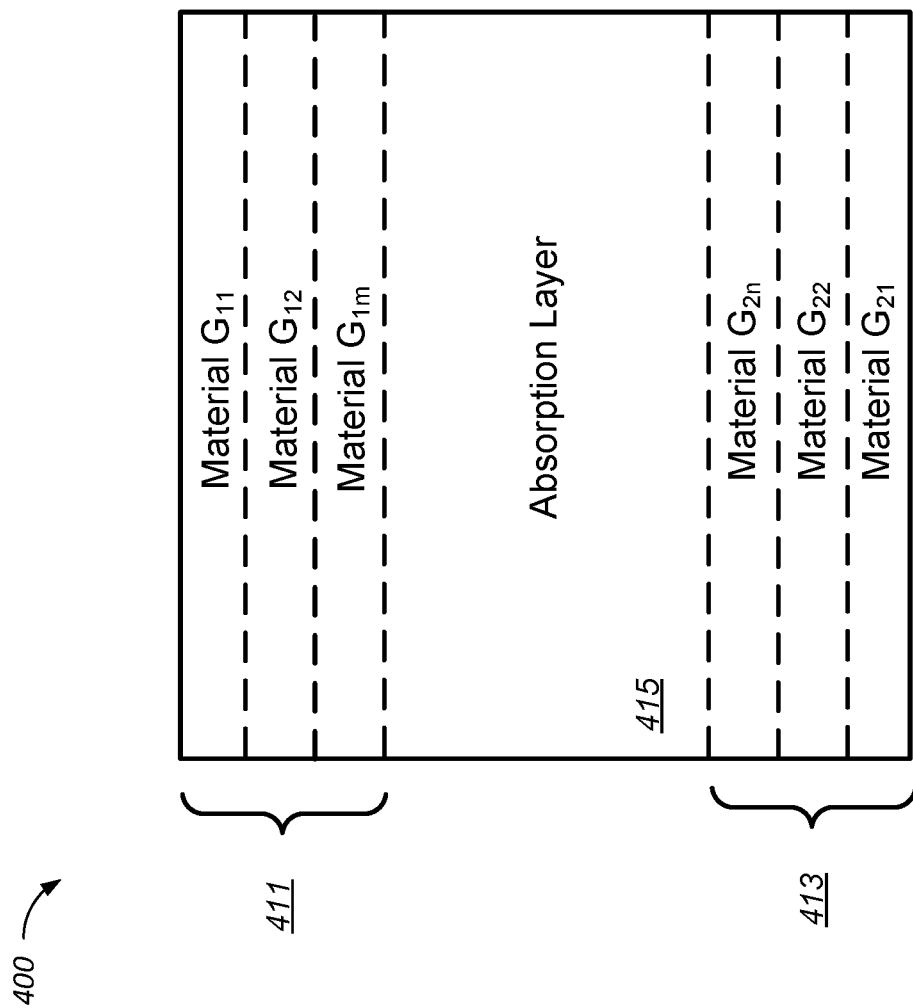
FIGS. 4A-4C show examples of a graded material optical sensor.

FIG. 4A is an example of a graded material optical sensor 400. The graded material optical sensor 400 includes a first graded material layer 411, a second graded material layer 413, and an absorption layer 415. The first graded material layer 411 includes m layers of graded materials $G_{11}$ to $G_{1m}$, and second graded material layer 413 includes n layers of graded materials $G_{21}$ to $G_{2n}$, where m and n are integers. Each layer of the first graded material layer 411 and the second graded material layer 413 may be a germanium-silicon alloy. The absorption layer 415 may be germanium. In general, semiconductor surfaces and heterojunction interfaces are often high in defect density due to the discontinuity of material. These defects in turn acts as recombination sites for minority carriers. For optical sensors, these surface and/or interface defects may be detrimental if photo-generated minority carriers come in contact with the surface and/or interface defects. This problem can be especially severe if large proportions of the carriers are generated within the highly doped contact region. Carriers that are lost to recombination will affect the sensitivity/dynamic range of the optical sensor. This problem may be especially serious for a germanium-silicon optical sensor device or system, where germanium or germanium-silicon is epitaxially grown on silicon substrates. High density of defects can be observed at the germanium-silicon heterojunction interface as well as where the epitaxy is terminated. Incorporating the graded material structure design in an optical sensor allows minority carriers to be directed away from absorption layer surface and/or the germanium-silicon heterojunction interfaces by creating a built-in electric field through bandgap differences between graded material layers.

Figure 4B:
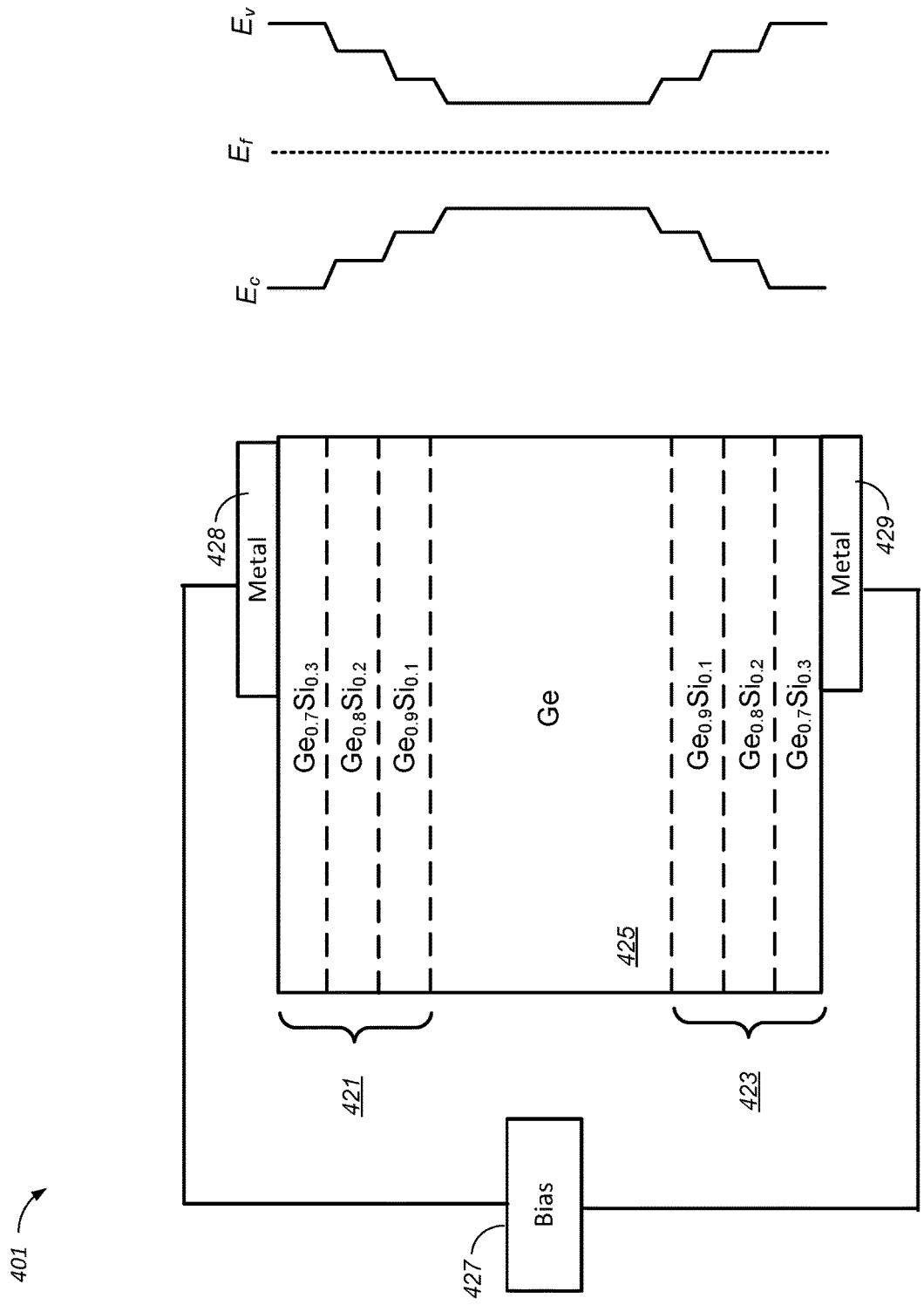

FIG. 4B is an example of a graded material optical sensor 401. The graded material optical sensor 401 includes a first graded material layer 421, a second graded material layer 423, an absorption layer 425, and metal contacts 428 and 429. The silicon composition in the first graded material layer 421 gradually increases in a direction from the absorption material 425 to the metal contact 428, where the corresponding energy bandgap increases accordingly. The silicon composition in the second graded material layer 423 also gradually increases in a direction from the absorption material 425 to the metal contact 429, where the corresponding energy bandgap increases accordingly. In some implementations, the photo-generated minority carriers by an optical signal may be directed away from the high defective surface/interface and hence surface/interface recombination can be alleviated. The alleviation of the surface/interface recombination improves photodiode optical to electrical conversion efficiency. The photodiode bandwidth is also improved since the total duration minority carriers spends within the highly doped region is significantly reduced. In some implementations, the increased Si composition may reduce the amount of carriers generated due to reduced NIR absorption from increase in bandgap. Hence decreasing the total number of photo-generated minority carriers close to the surface/interface thus further reducing minority carriers reaching the layer surface/interface.

In some implementations, a control bias 427 may be applied to the graded material optical sensor 401. For example, the control bias may be a reverse bias in voltage. The control bias may increase the electric field between the first graded material layer 421 and the second graded material layer 423, which may further enhance free carriers transit towards a carrier-collection circuitry coupled to the metal contacts 428 and 429.

Figure 4C:
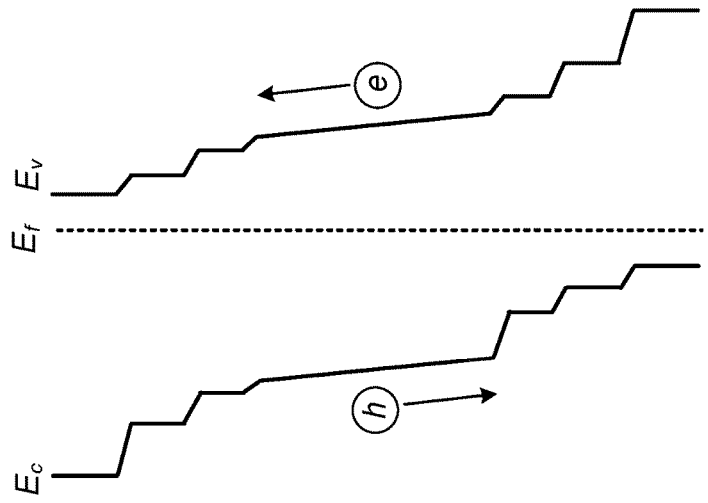
Figure 4C:
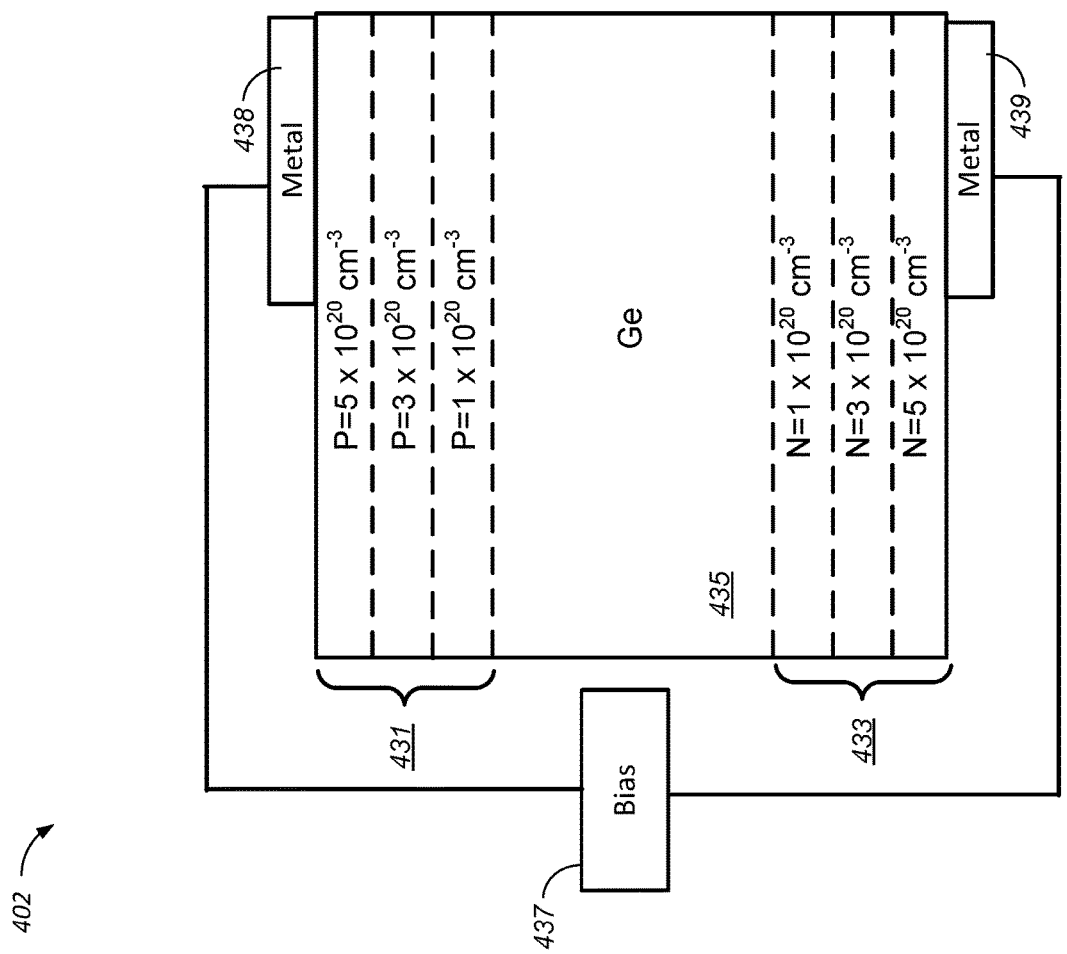

FIG. 4C is an example of a graded material optical sensor 402. The graded material optical sensor 402 includes a first graded material layer 431, a second graded material layer 433, an absorption layer 435, and metal contacts 438 and 439. The first graded material layer 431 may have alloy composition similar to the first graded material layer 421 as described in reference to FIG. 4B. The second graded material layer 433 may have alloy composition similar to the second graded material layer 423 as described in reference to FIG. 4B. The p-dopant concentration in the first graded material layer 431 gradually increases in a direction from the absorption material 435 to the metal contact 438. The n-dopant concentration in the second graded material layer 433 gradually increases in a direction from the absorption material 435 to the metal contact 439. When the thermal equilibrium is reached, an electric field may be formed in the first graded material layer 431 and in the second graded material layer 433. The electric field enhances the acceleration of minority carriers moving out of the respective un-depleted doping layers. In some implementations, a control bias may be applied to the graded material optical sensor 402. The control bias may increase the electric field between the first graded material layer 431 and the second graded material layer 433, which may further enhance the acceleration of minority carriers moving out of the respective un-depleted doping layers.

Figure 5:
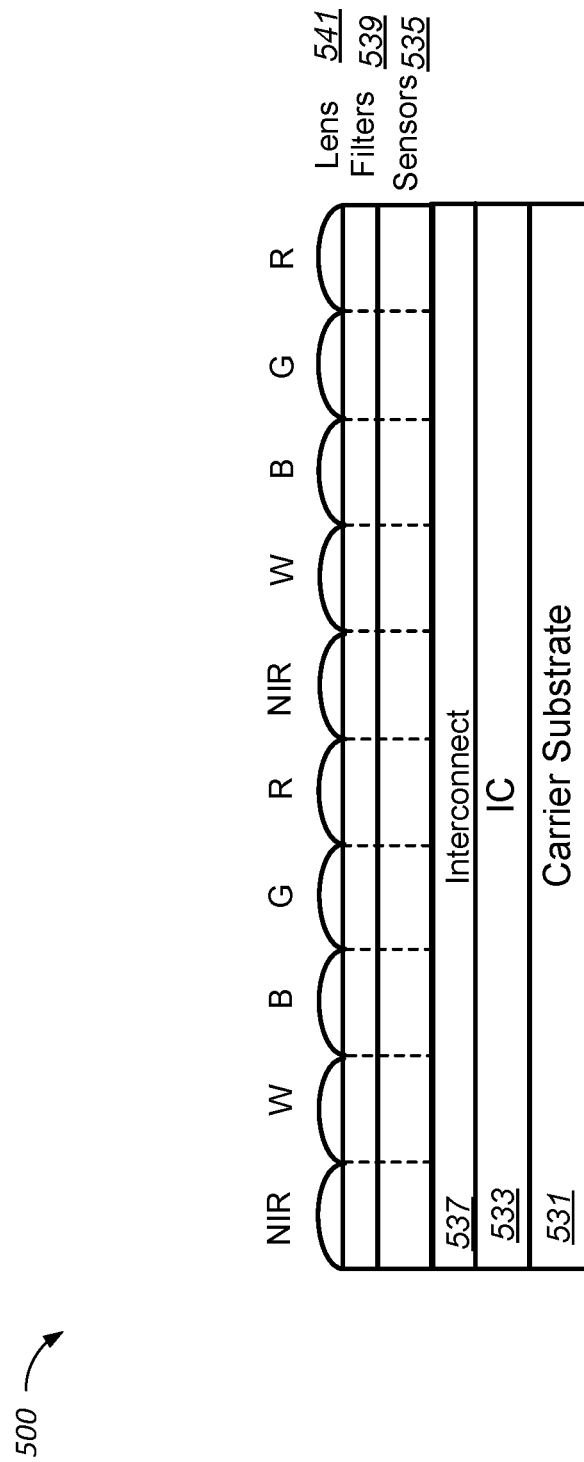
FIG. 5 shows an example of an optical sensor array.

FIG. 5 shows an example of an optical sensor array 501. The optical sensor array 501 includes a carrier substrate 531, an integrated circuit layer 533, a sensor layer 535, an interconnect layer 537, a filter layer 539, and a lens layer 541. The sensor layer 535 may be formed as a one-dimensional or a two-dimensional array of graded material optical sensors. Similar to the described in FIGS. 2A-2J and FIGS. 3A-3J, after the sensor layer 535 is formed on a substrate (not shown), the interconnect layer 537 may be formed on the sensor layer 535, and the interconnect layer 537 may be bonded to the integrated circuit layer 533. After bonding, the filter layer 539 and a lens layer 541 may be formed on the sensor layer 535. This may be referred to as a "backside" configuration. The exemplary letters W, B, G, R refer to "White", "Blue", "Green", "Red" pixels respectively. In some other implementations, R, G, B or R, G, G, B or other arrangements may be applied.

Sensors Formed Using Lateral Strain Dilution Technique

Traditional Si CMOS image sensor has very limited NIR sensing capability due to weak light absorption of Si material for wavelength beyond 800 nm. One possible approach is to replace photo sensing material from silicon to germanium-silicon to improve NIR sensing from 800 nm to beyond 1000 nm. However, lattice mismatch between silicon and germanium-silicon may limit the critical thickness of the germanium-silicon layer that can be grown on silicon, which may be thinner than the desired thickness for image sensing. When growing beyond this critical thickness, the germanium-silicon layer may become defective and introduce additional dark current.

An optical sensor based on a necking region structural design, fabricated by using a lateral strain dilution technique may share and dilute the strain energy of a germanium-silicon layer, and may therefore enable the thickness of the germanium-silicon layer to extend beyond the critical thickness without defect formation. FIGS. 6A-6C illustrate an example design 600 for fabricating an optical sensor using a lateral strain dilution technique.

Referring to FIG. 6A, a dielectric layer 613 is formed on a substrate 611. The substrate 611 may be a silicon substrate, and the dielectric layer 613 may be formed by any suitable dielectric materials such as oxide. A thickness of the dielectric layer 613 is selected to be $\{h_1+h_2\}$, where $h_1$ and $h_2$ correspond to the heights of a necking region and a sensor region, respectively.

Referring to FIG. 6B, a necking region 621 and a sensor region 623 is formed in the dielectric layer 613. The necking region 621 has an area $A_1$ and a height $h_1$, and the sensor region 623 has an area $A_2$ and a height $h_2$. In general, the area $A_1$ of the necking region 621 is smaller than the area $A_2$ of the sensor region 623. The necking region 621 and the sensor region 623 may be formed by any suitable techniques. For example, the necking region 621 and the sensor region 623 may be formed by a two-step dry etch of the dielectric layer 613.

Strain energy $E_e$ may be defined by:

$$E_e = B \cdot f^2 \cdot h_1 + B \cdot f^2 \cdot h_2 \left(\frac{A_1}{A_2}\right), \quad (1)$$

$$f = (a_l - a_s)/a_s, \quad (2)$$

where f is the lattice misfit ratio, $a_l$ is the layer lattice constant, as is the substrate lattice constant, B is the material constant, $A_1$ and $h_1$ are the area and the height of the necking 621, and $A_2$ and $h_2$ are the height of the sensor region 623, respectively.

Referring to FIG. 6C, germanium-silicon is selectively grown in the necking region 621 and the sensor region 623. In general, the strain energy mainly comes from the necking region 621. The sensor region 623 is not in direct contact with the silicon substrate interface. Therefore, the sensor region 623 is not directly constrained by silicon substrate 611 and can be used to absorb the strain energy of the necking area. The critical thickness can be extended to a level of ~A2/A1. Thus, critical thickness may be enhanced by using this lateral strain sharing approach.

In some implementations, a planarization step such as CMP is performed to planarize the surface area of the germanium-silicon film.

Figure 7:
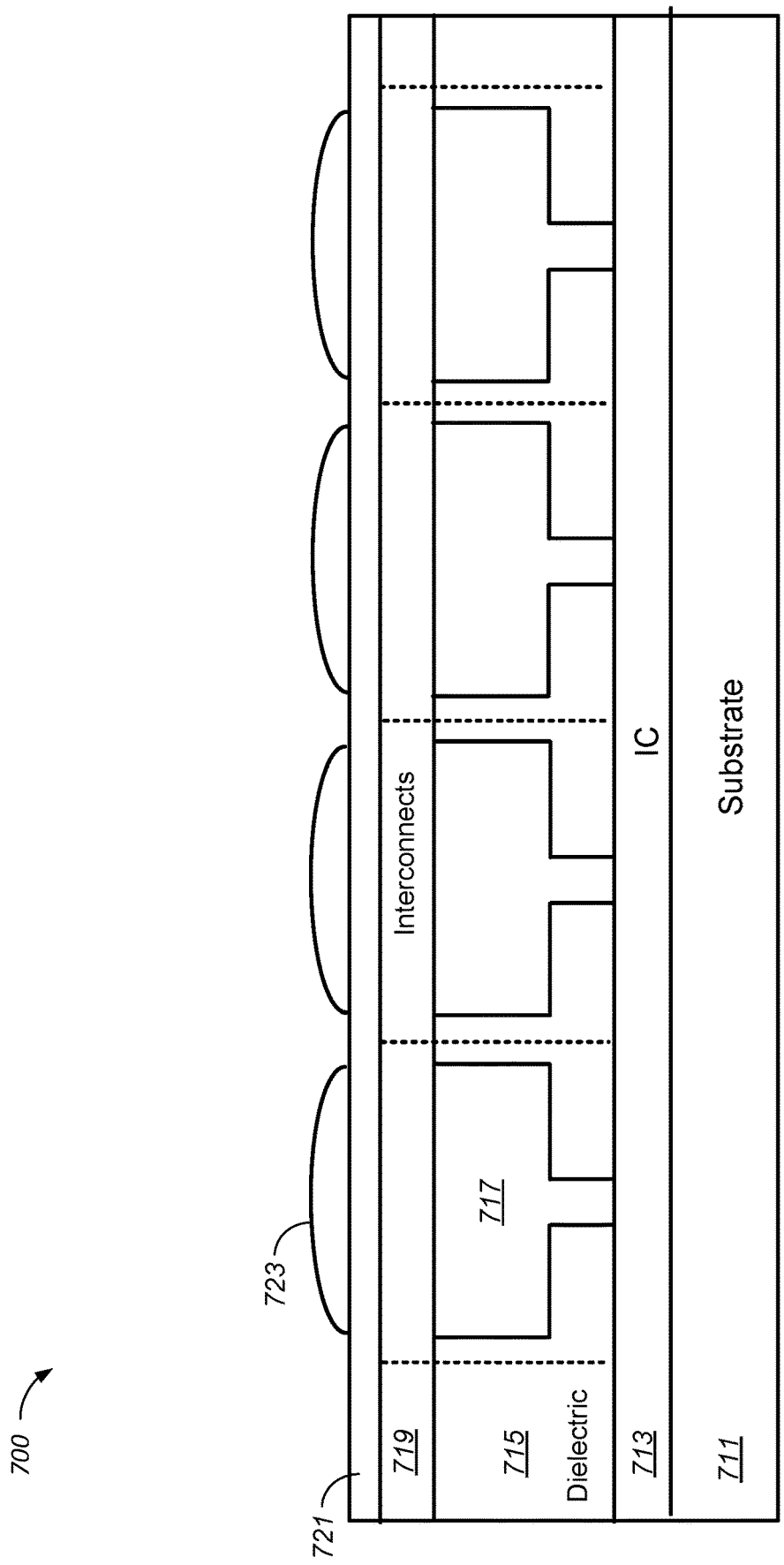
FIG. 7 shows an example of an optical sensor array formed by a lateral strain dilution technique.

FIG. 7 shows an example optical sensor array 700 formed by a lateral strain dilution technique. The optical sensor array 700 includes a substrate 711, an integrated circuit layer 713, a dielectric layer 715, optical sensors 717, an interconnect layer 719, a coating layer 721, and lens 723. The integrated circuit layer 713 may be an epitaxially-grown silicon with circuitry and contacts formed on it. The optical sensors 717 may be formed on the integrated circuit layer 713 having necking region structural design and using a lateral strain dilution technique as described in reference to FIGS. 6A-6C. The optical sensor array 700 may be referred to as a front side incidence optical sensor array, as light enters from the front side of the optical sensors 717. The optical sensor array 700 may be used to detect both visible and near infrared optical signals.

Figure 8A:
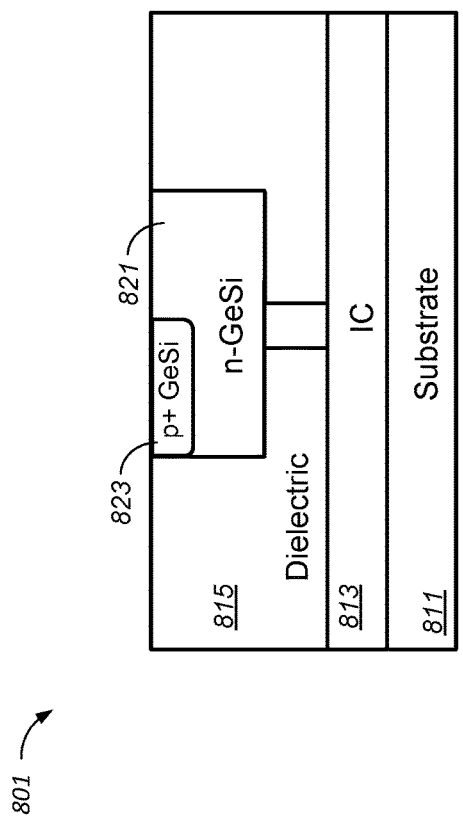
FIGS. 8A-8B show design examples of an optical sensor formed by a lateral strain dilution technique.

FIG. 8A shows an example of a two-terminal optical sensor 801 with a necking region structural design. The two-terminal optical sensor 801 may be used in a front side incidence optical sensor array. The two-terminal optical sensor 801 includes a substrate 811, an integrated circuit layer 813, a dielectric layer 815, and a germanium-silicon sensor with a necking region. The sensor region of the germanium silicon sensor includes an n-doped germanium-silicon region 821 and a p+ doped germanium-silicon region 823.

Figure 8B:
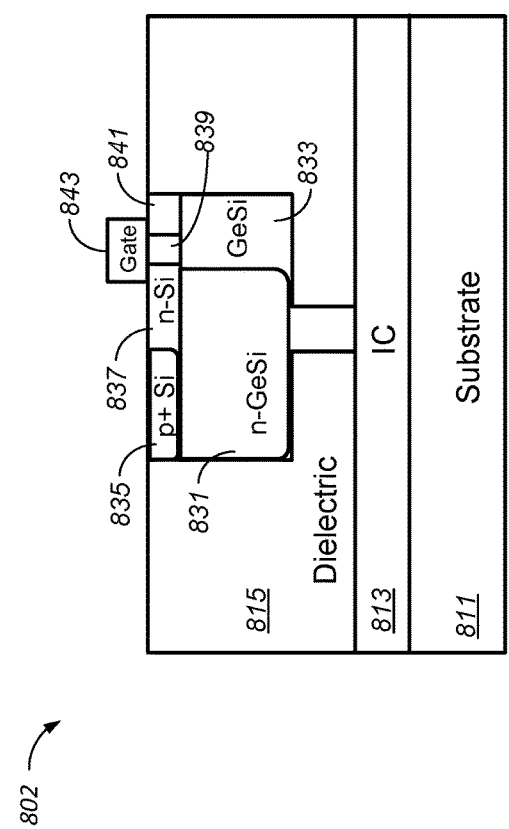

FIG. 8B shows an example of a three-terminal optical sensor 802 with a necking region structural design. The three-terminal optical sensor 802 may be used in a front side incidence optical sensor array. The three-terminal optical sensor 802 includes a substrate 811, an integrated circuit layer 813, a dielectric layer 815, and a germanium-silicon sensor with a necking region. The sensor region of the germanium-silicon sensor includes an n-doped germanium-silicon region 831, and an intrinsic or p-doped germanium-silicon region 833. A silicon layer is formed on the sensor region, where the silicon layer includes a p+ silicon region 835, an n-doped silicon region 837, a p-doped silicon region 839, an n+ silicon region 841, and a transfer gate 843.

Figure 9:
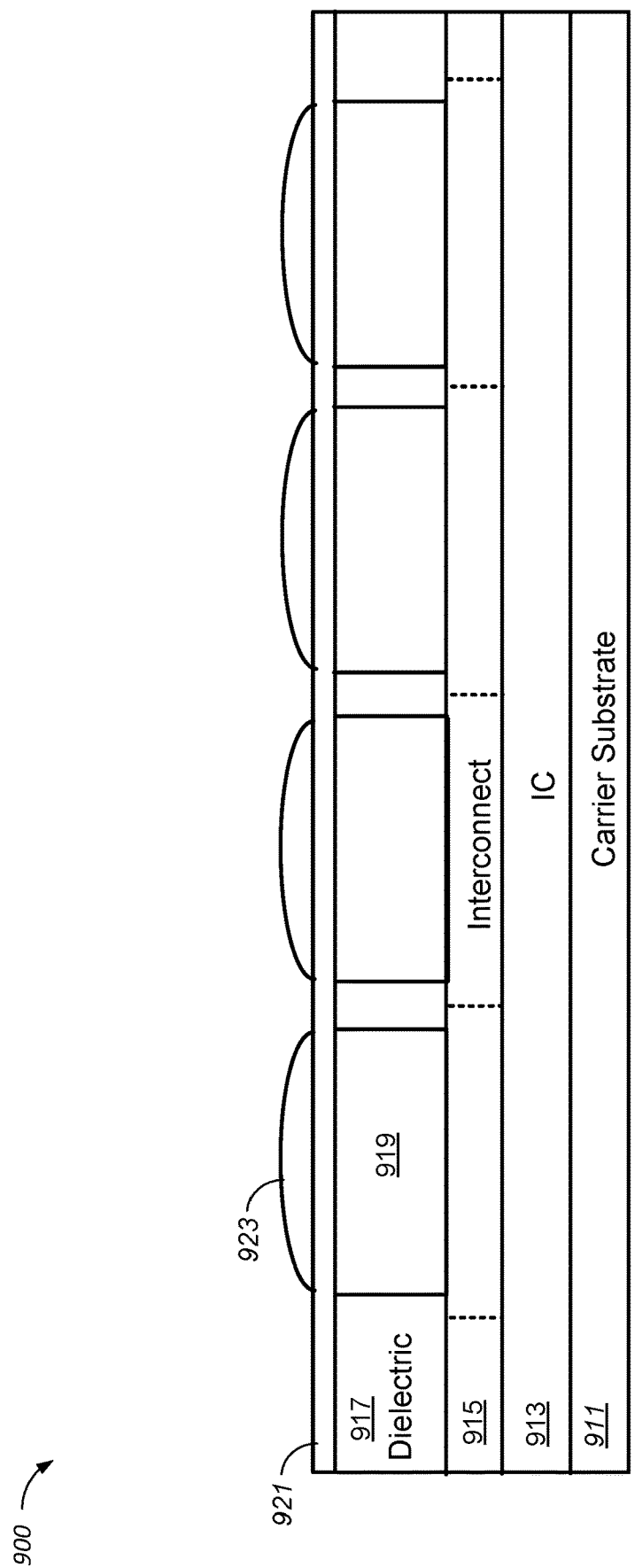
FIG. 9 shows an example of an optical sensor array formed by a lateral strain dilution technique.

FIG. 9 shows an example of an optical sensor array 900 formed by a lateral strain dilution technique. The optical sensor array 900 includes a carrier substrate 911, an integrated circuit layer 913, an interconnect layer 915, a dielectric layer 917, optical sensors 919, a coating layer 921, and lens 923. The integrated circuit layer 913 may be an epitaxially-grown silicon with circuitry and contacts formed on it. The optical sensors 919 may be formed having necking region structural design and using the lateral strain dilution technique as described in reference to FIGS. 6A-6C. The optical sensors 919 and the interconnect layer 915 may then be wafer-bonded to the integrated circuit layer 913 using techniques described in reference to FIGS. 10A-10E. The optical sensor array 900 may be referred to as a backside incidence optical sensor array, as light enters from the backside of the optical sensors 919. The optical sensor array 900 may be used to detect both visible and near infrared optical signals.

Figure 10A:
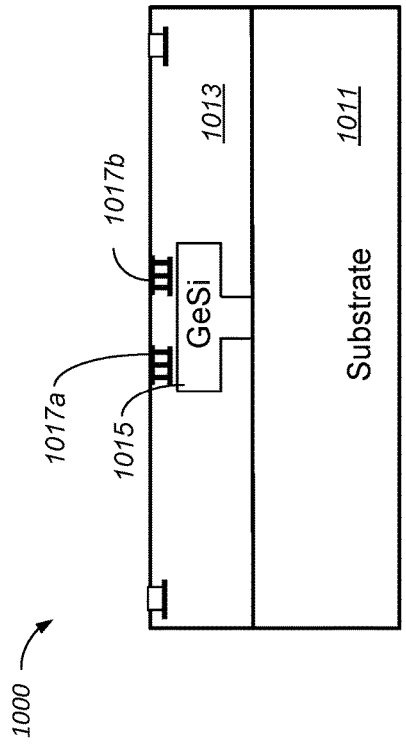
Figure 10B:
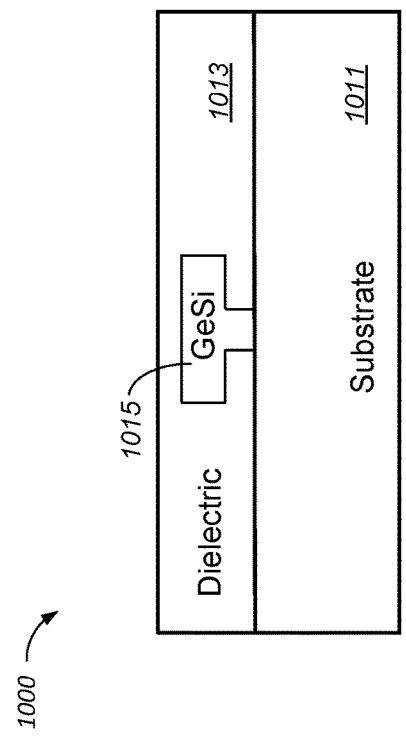

FIGS. 10A-10E illustrate an example design 1000 for fabricating an optical sensor using a lateral strain dilution technique. Referring to FIG. 10A, a germanium-silicon optical sensor 1015 is formed on a substrate 1011 using the lateral strain dilution technique as described in reference to FIGS. 6A-6C. Referring to FIG. 10B, interconnects 1017A and 1017B are formed on the front side of the germanium-silicon optical sensor 1015.

Figure 10C:
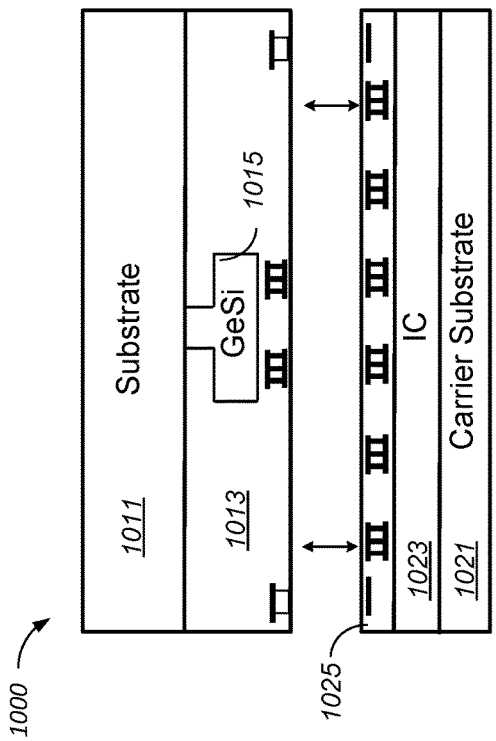

Referring to FIG. 10C, an integrated circuit layer 1023 and an interconnect layer 1025 formed on a carrier substrate is bonded with the dielectric layer 1013 using techniques similar to described in reference to FIGS. 2G and 3G. Referring to FIG. 10D, the substrate 1011 and the necking region of the germanium-silicon optical sensor 1015 are removed by techniques such as CMP or etching.

Referring to FIG. 10E, interconnects 1027a and 1027b are formed in the dielectric layer 1013. Referring to FIG. 10F, one or more coating layer 1031 and lens 1033 are formed using techniques similar to described in reference to FIGS. 2J and 3J.

FIG. 11A shows an example of a two-terminal optical sensor 1101 with a necking region structural design. The two-terminal optical sensor 1101 may be used in a backside incidence optical sensor array. The two-terminal optical sensor 1101 includes a substrate 1111, an integrated circuit layer 1113, an interconnect layer 1115, a dielectric layer 1117, and a germanium-silicon sensor with a necking region removed. The sensor region of the germanium-silicon sensor includes an n-doped germanium-silicon region 1121 and a p+ doped germanium-silicon region 1123.

FIG. 11B shows an example of a three-terminal optical sensor 1102 with a necking region structural design. The three-terminal optical sensor 1102 may be used in a backside incidence optical sensor array. The three-terminal optical sensor 1102 includes a substrate 1111, an integrated circuit layer 1113, an interconnect layer 1115, a dielectric layer 1117, and a germanium-silicon sensor with a necking region removed. The sensor region of the germanium-silicon sensor includes an n-doped germanium-silicon region 1131, and an intrinsic or p-doped germanium-silicon region 1133. A silicon layer is formed in the interconnect layer 1115, where the silicon layer includes a p+ silicon region 1135, an n-doped silicon region 1137, a p-doped silicon region 1139, an n+ silicon region 1141, and a transfer gate 1143.

Energy Selection Optical Sensors

In general, an electrical signal generated by an optical sensor includes two current components: a dark current and a photocurrent. Photocurrent is the desired signal and the dark current is often considered as noise. Conventionally these two current components are collected together, and to improve the signal-to-noise ratio (SNR), the dark current component needs to be minimized. However, to achieve a wider sensing spectrum with an improved absorption efficiency (i.e., a higher photocurrent at the target wavelengths), a smaller bandgap material (direct or indirect) needs to be used, and this often leads to higher dark current. As a result, conventionally there is a material-induced trade-off between sensing spectrum/efficiency and dark current. Improved photocurrent (absorption efficiency) often comes with larger dark current (noise). Consequently, it is difficult to improve the SNR or dynamic range of the optical sensor.

Figure 12:
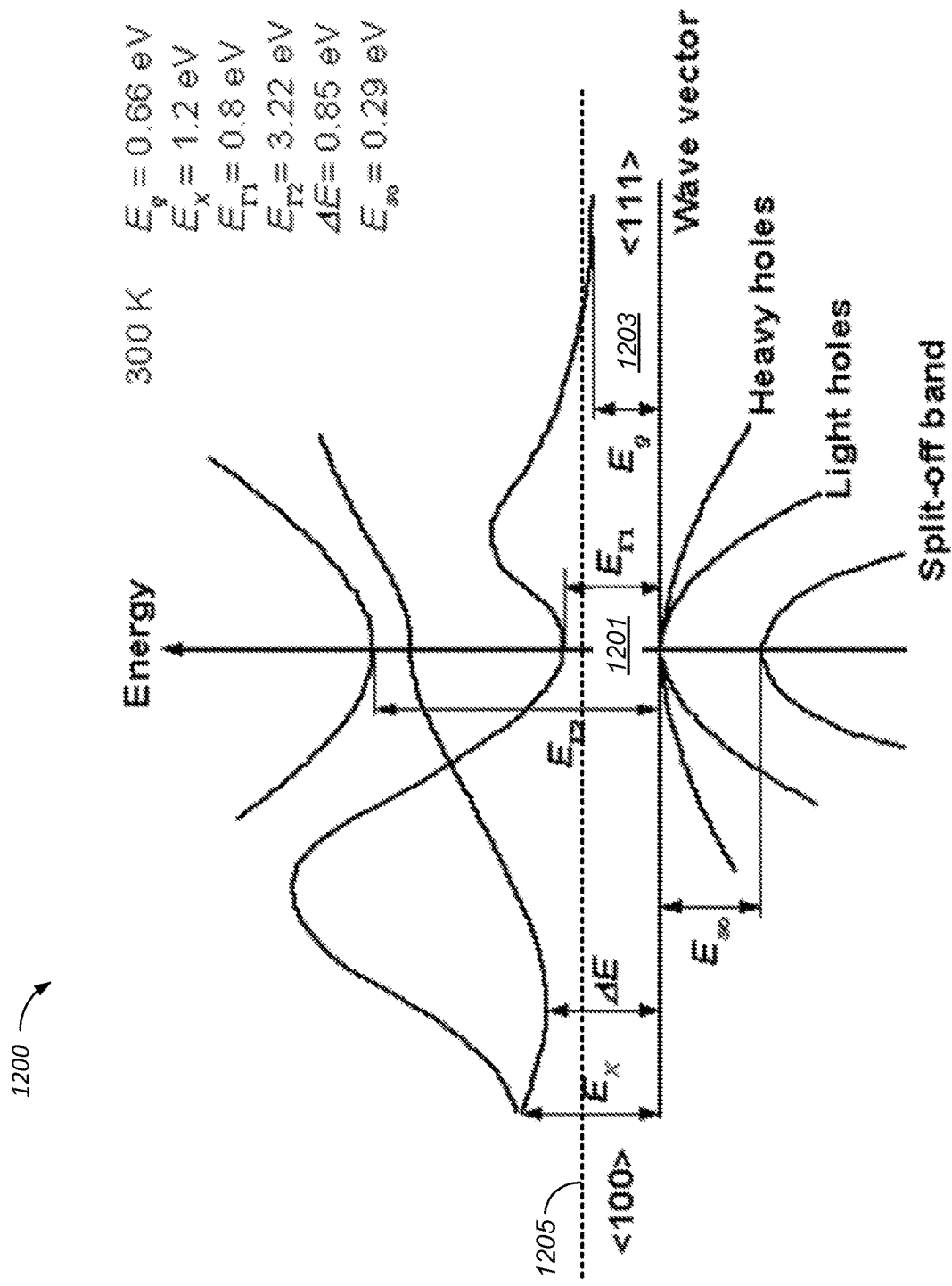
FIG. 12 shows an example of an energy diagram.

FIG. 12 shows an example energy diagram 1200. Referring to FIG. 12, to separate photocurrent from dark current, the key is on their transient state energy level difference. The root difference between photocurrent and dark current at their initial energy state is that the excited photons (photocurrent component) often occupies higher energy state above the conduction band (i.e., $E_{\Gamma 1}$ 1201), as compared to the often thermally generated carriers (dark current) around the conduction band edge (i.e., $E_g$ 1203). The higher energy photon-excited carrier will transit into a lower energy state by photon or phonon emitting processes (referred as "relaxation" in this disclosure), and when the energy relaxation is complete, photo current and dark current are difficult, or even impossible, to distinguish.

Conventionally, a conducting material (ex: metal) to collect the carriers is connected to the absorption material, which introduces no or little energy barrier to collect the carriers, hence collecting both photo and dark current components. By introducing an energy barrier at 1205, the lower energy state dark current component is blocked while the higher energy state photo current component can pass through the blocking material and being collected by the carrier collector terminals. In some implementations, the carrier transit time is preferably shorter than the energy relaxation time such that there is energy difference between photo current and dark current. An electric field may be applied between two terminals to provide high transit time for efficient carrier collection.

FIG. 13 illustrates an example energy selection sensor 1300. The energy selection sensor 1300 includes an absorption material 1311, an energy filter 1313, and a carrier collector 1315. The band alignment at the interface of the absorption material 1311 and the energy filter 1313 has an energy barrier to prevent the lower energy state dark current component from being collected, while allowing the higher energy state photon-excited photocurrent component to flow through the blocking material and being collected at the carrier collecting terminals. As a result, most of the desired signal (photo current) can be collected without collecting a majority of the noise (dark current).

In some implementations, the distance within the absorption material, between the two carrier extraction interfaces, is applied with an electrical field, and the distance/thickness between the two carrier extraction interfaces is within a range such that when the generated photo carrier travels to the energy filter 1313, the residual energy is still higher than the dark current components such that these two components can be distinguished by their energy level to allow the blocking mechanism functioning to only one of the current component (i.e., dark current). Namely, the time it takes for the photon-excited carrier to travel to the interface is preferably shorter than or comparable to the energy relaxation time (ex: an order of magnitude shorter).

In some implementations, the energy relaxation time can be determined or modified by (a) using quantum confinement effect (ex: quantum dot, quantum wire, quantum well structures), (b) choice of indirect or direct bandgap material (intra-valley or inter-valley transition), (c) the density state and its occupancy of the material, (d) incident photon energy. In some implementations, material with indirect bandgap, or larger valley to valley separation, or lower density states can be used to increase the energy relaxation time.

In some implementations, the bandgap of the energy filter material 1313 is larger than the absorption material 1311, with a conduction band offset high enough to block the dark current and low enough to allow the photocurrent to pass. In some implementations, the energy filter material can have a significant energy barrier even higher than the energy level of the photo-excited carriers near the carrier collector 1315 interface, but includes at least one trap state with an energy level allowing the photo-excited carriers to pass the energy filter 1313 by mechanisms such as trap-assisted tunneling. In some implementations, the energy filter 1313 is thin enough to allow the higher energy carriers to tunnel directly through but block the lower energy carriers. Note that applying an electrical field will bend the band diagram and increase the carrier velocity.

In some implementations, the incident light direction is substantially different (ex: perpendicular) to the direction of the applied electrical field in the absorption material. In this case, the distance/thickness along the incident light direction can be sufficiently long to absorb enough incident light (photons) for further signal processing. In some other implementations, the incident light direction is substantially along the direction of the applied electrical field in the absorption material. In this case, the design of the distance/thickness along the incident light direction requires taking both the targeted amount of absorption and the carrier transit time (preferably shorter or comparable to the relaxation time) into account.

In some implementations, germanium, silicon, germanium-silicon, graded materials, III-V compounds, II-VI compounds, or their combination may be used as the absorption material 1311, and germanium-silicon, silicon, GeO, GeO2, oxide, nitride, graded materials or their combinations may be used as the energy filter 1313. In some implementations, the energy filter 1313 may be selected to filter electrons. In some implementations, the energy filter 1313 may be selected to filter holes. In some implementations, a passivation material can be used to passivate the surface of the absorption material to reduce the surface recombination for more efficient photo-excited carrier collection.

In some implantations, a nano-crystal structure can be used. The nano-crystal can further merge with one another to form a continuous layer. The nano-crystal structure may be used to modify its energy relaxation time due to quantum confinement. The nano-crystal structure may further reduce its intrinsic dark current generation due to quantum confinement. In some implementations, the nano-crystal can include Ge, and it can be formed by depositing Ge at low temperature on a heterogeneous material surface (ex: Si) such that Ge nucleates on the surface to form nano-crystal. In some implementations, the Ge can be deposited/grown via PVD or CVD, and it can be in an amorphous, a poly or a crystalline phase. The carrier collection can be done by applying an electrical field as described previously in this disclosure.

In some implementations, the absorption material can be Ge, Si, GeSi, III-V material or other compounds, alloys, two-dimensional material, elemental material which can absorb the target application wavelengths. The absorption material can be strained or relaxed to modify its bandgap to obtain a desired absorption rate. In some implementations, the absorption material can even be porous. In some implementations, the energy filter material can be Ge, Si, GeSi, nitride, oxide, doped nitride, doped oxide, III-V material or other compounds, alloys, elemental material which can introduce energy barrier to the absorption material at their interface. The energy filter material can even be porous. In some implementations, the absorption material is Ge, and its thickness/dimension is less than 100 nm. In some implementations, the thickness of the Ge can be around 50 nm such that an average carrier transit time is less than 500 fs to be with the same order of its energy relaxation time around hundreds of fs. In some implementations, the voltage applied to a Ge absorption layer needs to cause an electrical-field larger than 1000 V/cm to reach a high carrier velocity and lower than 100000 V/cm to be below the breakdown limit.

In some implementations, the energy filter material can be Si with larger bandgap and type I or type II (strained) band alignment to confine the lower energy carriers in a Ge absorption region. In some implementations, the energy filter material can be nitride with defects introduced inside to form a trapping energy state corresponding to the residual energy state when that the photo-excited carriers travel to the interface of absorption material 1311 and energy filter 1313.

A number of implementations have been described. Nevertheless, it will be understood that various modifications may be made without departing from the spirit and scope of the disclosure. For example, various forms of the flows shown above may be used, with steps re-ordered, added, or removed.

Various implementations may have been discussed using two-dimensional cross-sections for easy description and illustration purpose. Nevertheless, the three-dimensional variations and derivations should also be included within the scope of the disclosure as long as there are corresponding two-dimensional cross-sections in the three-dimensional structures.

While this specification contains many specifics, these should not be construed as limitations, but rather as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products.

Thus, particular embodiments have been described. Other embodiments are within the scope of the following claims. For example, the actions recited in the claims may be performed in a different order and still achieve desirable results.

What is claimed is:

1. A method for fabricating an optical sensor, the method comprising:
   forming a first material layer comprising a first alloy of germanium and silicon having a first germanium composition;
   forming, over the first material layer, a graded material layer comprising germanium and silicon;
   forming, over the graded material layer, a second material layer comprising a second alloy of germanium and silicon having a second germanium composition;
   forming a first dielectric layer over the second material layer;
   bonding the first dielectric layer to a circuitry formed over a carrier substrate; and
   wherein the first germanium composition is lower than the second germanium composition and a germanium composition of the graded material layer is between the first germanium composition and the second germanium composition and varies along a direction perpendicular to the substrate,
   wherein the compositions of germanium of the graded material increase along the direction that is from the first material layer to the second material layer.

2. The method of claim 1, further comprising:
   forming a segregation layer over a substrate before the forming of the first material layer.

3. The method of claim 2, further comprising:
   removing the substrate and the segregation layer after the bonding of the first dielectric to the circuitry.

4. The method of claim 1, further comprising:
   forming a coating layer over the second material layer.

5. The method of claim 1, further comprising:
   forming multiple first interconnects in the first dielectric layer before the bonding of the first dielectric layer to the circuitry.

6. The method of claim 1, further comprising:
   forming a second dielectric layer on the circuitry before the bonding of the first dielectric layer to the circuitry.

7. The method of claim 6, further comprising:
   forming multiple second interconnects in the second dielectric layer after the forming of the second dielectric layer.

8. The method of claim 1, further comprising:
   forming a lens over the second material layer.

9. The method of claim 1, wherein the graded material layer is gradient-doped.

10. A method for fabricating an optical sensor, the method comprising:
   forming a first graded material layer comprising a composition or multiple first-doped levels along a particular direction, wherein the composition of the first graded material layer is of a first material and a second material, and the composition of the second material of the first graded material layer vary along a particular direction;
   forming, over the first graded material layer, an absorption layer comprising the second material,
   forming, over the absorption layer, a second graded material layer comprising a composition or multiple second-doped levels along a particular direction, wherein the composition of the second graded material layer is of the first material and the second material, wherein the composition of the second material of the second graded material layer vary along the particular direction;
   forming a first dielectric layer over the second graded material layer; and
   bonding the first dielectric layer to a circuitry formed over a carrier substrate;
   wherein the particular direction is a direction from the first graded material layer to the second graded material layer, wherein the composition of second material of the first graded material layer increase along the particular direction, and wherein the composition of second material of the second graded material layer decrease along the particular direction, wherein a doping polarity of the first-doped levels and a doping polarity of the second-doped levels are different.

11. The method of claim 10, wherein the first graded material layer comprises the composition, the second material is germanium and the first material is silicon.

12. The method of claim 10, further comprising:
   forming a segregation layer over a substrate before the forming of the first graded material layer.

13. The method of claim 12, further comprising:
   removing the substrate and the segregation layer after the bonding of the first dielectric to the circuitry.

14. The method of claim 10, further comprising:
   forming a coating layer over the second graded material layer.

15. The method of claim 10, further comprising:
   forming multiple first interconnects in the first dielectric layer before bonding of the first dielectric layer to the circuitry.

16. The method of claim 10, further comprising:
   forming a second dielectric layer on the circuitry before bonding of the first dielectric layer to the circuitry.

17. The method of claim 16, further comprising:
   forming multiple second interconnects in the second dielectric layer after the forming of the second dielectric layer.

18. The method of claim 10 further comprising:
   forming a lens over the second graded material layer.

19. The method of claim 10, wherein the first graded material layer comprises multiple first-doped levels and the second graded material layer comprises multiple second-doped levels, and wherein multiple first-doped levels gradually decrease along the particular direction and/or the multiple second doped levels gradually increase along the particular direction.

20. A method for fabricating an optical sensor, the method comprising:
   forming a first material layer comprising a first alloy of germanium and silicon having a first germanium composition;
   forming, over the first material layer, a graded material layer comprising germanium and silicon;
   forming, over the graded material layer, a second material layer comprising a second alloy of germanium and silicon having a second germanium composition;
   forming a first dielectric layer over the second material layer;
   forming multiple first interconnects in the first dielectric layer; and
   bonding the first dielectric layer to a circuitry formed over a carrier substrate after the forming multiple first interconnects in the first dielectric layer,
   wherein the first germanium composition is lower than the second germanium composition and a germanium composition of the graded material layer is between the first germanium composition and the second germanium composition and varies along a direction perpendicular to the substrate.

* * * * *